(12) United States Patent
Wang

(10) Patent No.: US 12,088,276 B2
(45) Date of Patent: Sep. 10, 2024

(54) METHOD OF MANUFACTURING AN FBAR STRUCTURE

(71) Applicant: Shenzhen Newsonic Technologies Co., Ltd., Shenzhen (CN)

(72) Inventor: Jian Wang, Shenzhen (CN)

(73) Assignee: Shenzhen Newsonic Technologies Co., Ltd., Shenzhen (CN)

( * ) Notice: Subject to any disclaimer, the term of this patent is extended or adjusted under 35 U.S.C. 154(b) by 0 days.

(21) Appl. No.: 17/885,704

(22) Filed: Aug. 11, 2022

(65) Prior Publication Data
US 2022/0393663 A1    Dec. 8, 2022

Related U.S. Application Data

(63) Continuation of application No. 17/648,222, filed on Jan. 18, 2022, now Pat. No. 11,463,070.

(51) Int. Cl.
| | | |
|---|---|---|
| H03H 9/17 | (2006.01) | |
| H03H 3/02 | (2006.01) | |
| H03H 9/02 | (2006.01) | |
| H03H 9/13 | (2006.01) | |

(52) U.S. Cl.
CPC .............. *H03H 9/173* (2013.01); *H03H 3/02* (2013.01); *H03H 9/02031* (2013.01); *H03H 9/132* (2013.01); *H03H 9/176* (2013.01); *H03H 2003/021* (2013.01)

(58) Field of Classification Search
CPC .... H03H 9/132; H03H 9/02031; H03H 9/173; H03H 9/176; H03H 3/02; H03H 2003/021
See application file for complete search history.

(56) References Cited

U.S. PATENT DOCUMENTS

| | | | | |
|---|---|---|---|---|
| 8,546,240 B2* | 10/2013 | Harame | .................. | G06F 30/39 |
| | | | | 438/422 |
| 9,374,059 B1* | 6/2016 | Hurwitz | .................. | H03H 3/02 |
| 10,153,750 B2* | 12/2018 | Hurwitz | .................. | H01L 24/14 |

(Continued)

FOREIGN PATENT DOCUMENTS

| | | |
|---|---|---|
| CN | 105703732 A | 6/2016 |
| CN | 107181469 A | 9/2017 |

(Continued)

OTHER PUBLICATIONS

Chinese Office Action from CN Appl. No. 202210064954.3, mail date Mar. 7, 2022, 8 pages.

*Primary Examiner* — Jeffrey T Carley
(74) *Attorney, Agent, or Firm* — Finnegan, Henderson, Farabow, Garrett & Dunner, LLP.

(57) ABSTRACT

A method for forming a film bulk acoustic resonator (FBAR) structure includes: sequentially forming a top electrode layer, a piezoelectric layer, and a bottom electrode layer on a first substrate; patterning the bottom electrode layer to form a bottom electrode; forming a dielectric layer on the bottom electrode; bonding a bonding substrate onto the dielectric layer; removing the first substrate; patterning the top electrode layer to form a top electrode; forming an opening in the bonding substrate; selectively removing a portion of the dielectric layer to form a cavity; and bonding a bottom cap wafer onto the bonding substrate to seal the cavity.

14 Claims, 26 Drawing Sheets

(56) References Cited

U.S. PATENT DOCUMENTS

| | | | |
|---|---|---|---|
| 10,389,331 B2 * | 8/2019 | Hurwitz | H03H 9/0523 |
| 10,466,572 B2 * | 11/2019 | Hurwitz | G02F 1/353 |
| 2007/0194863 A1 | 8/2007 | Shibata | |
| 2008/0024041 A1 | 1/2008 | Shibata | |
| 2009/0108381 A1 | 4/2009 | Buchwalter | |
| 2010/0029031 A1 | 2/2010 | Perruchot | |
| 2010/0327995 A1 | 12/2010 | Reinhardt | |
| 2013/0106248 A1 | 5/2013 | Burak | |
| 2017/0264263 A1 * | 9/2017 | Huang | H03H 9/173 |
| 2017/0264265 A1 * | 9/2017 | Huang | H01P 7/065 |
| 2017/0338799 A1 | 11/2017 | Ruby | |
| 2019/0058455 A1 | 2/2019 | Kim | |
| 2020/0176666 A1 | 6/2020 | Lee | |
| 2020/0212884 A1 | 7/2020 | Shin | |
| 2021/0028751 A1 * | 1/2021 | Hurwitz | H01L 41/313 |
| 2021/0028754 A1 | 1/2021 | Hurwitz et al. | |
| 2021/0194456 A1 * | 6/2021 | Luo | H03H 3/02 |
| 2021/0234529 A1 | 7/2021 | Uno | |

FOREIGN PATENT DOCUMENTS

| | | | | |
|---|---|---|---|---|
| CN | 110098816 A | | 8/2019 | |
| CN | 110855264 A | | 2/2020 | |
| CN | 111010136 A | | 4/2020 | |
| CN | 111682101 A | * | 9/2020 | H01L 41/22 |
| CN | 112039461 A | | 12/2020 | |
| CN | 112039481 A | * | 12/2020 | |
| CN | 112039484 A | | 12/2020 | |
| CN | 113746446 A | | 12/2021 | |
| CN | 113783548 A | | 12/2021 | |
| CN | 114070223 A | * | 2/2022 | |
| WO | WO 2021258490 A1 | | 12/2021 | |

* cited by examiner

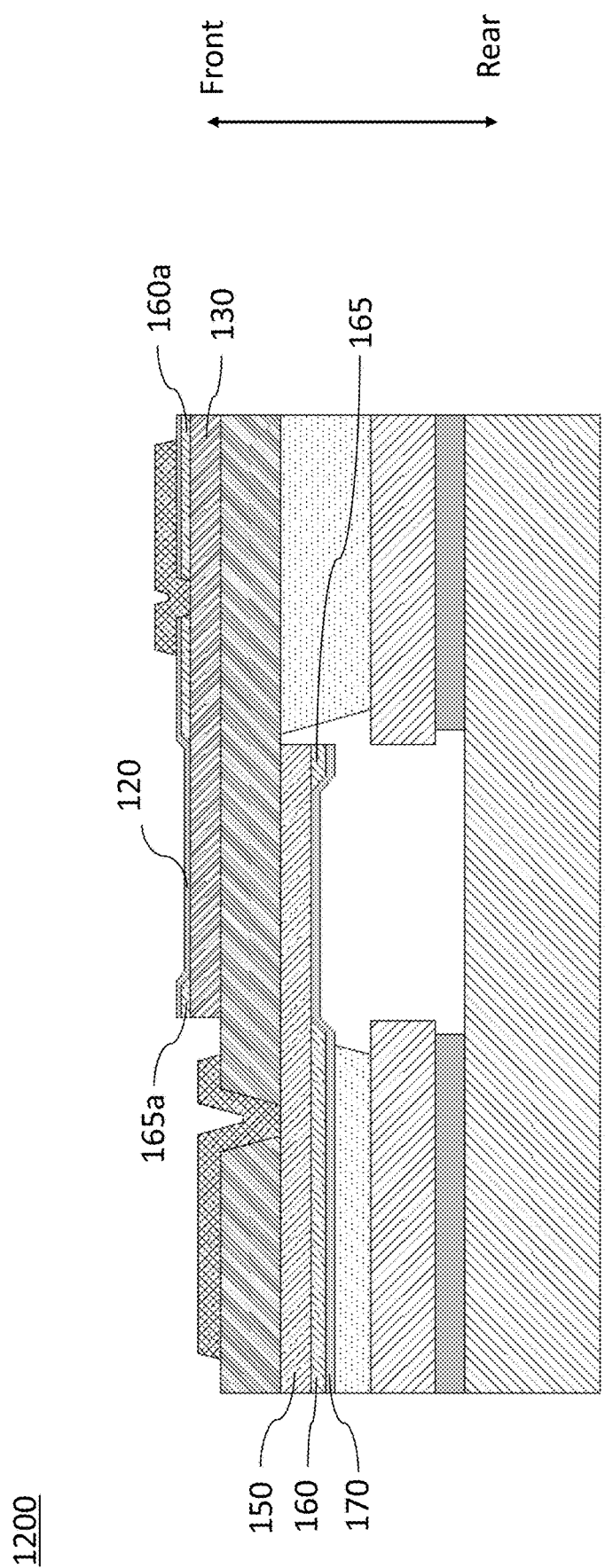

METHOD OF MANUFACTURING AN FBAR STRUCTURE

CROSS-REFERENCE TO RELATED APPLICATION

This application is a continuation of application Ser. No. 17/648,222, filed Jan. 18, 2022, now allowed, the entire contents of which are incorporated herein by reference.

FIELD OF THE DISCLOSURE

The present disclosure relates to the field of semiconductor devices and, in particular, to a film bulk acoustic resonator (FBAR) structure and a method of fabricating the FBAR structure.

BACKGROUND

A film bulk acoustic resonator (FBAR) is a device including a thin film that is made of a piezoelectric material and disposed between two electrodes. The FBAR device is typically fabricated using semiconductor micro-processing technology.

Due to its small thickness, the FBAR device may be used in applications requiring high frequency, small size, and light weight. An exemplary application of the FBAR device is a filter used in mobile communication devices.

SUMMARY

Embodiments of the present disclosure provide a film bulk acoustic resonator (FBAR) structure, including a top electrode, a piezoelectric layer disposed below the top electrode, a bottom electrode disposed below the piezoelectric layer, a dielectric layer disposed below the bottom electrode, a bonding substrate disposed below the dielectric layer, a bottom cap wafer disposed below the bonding substrate, and a cavity disposed below the bottom electrode and formed by the dielectric layer, the bonding substrate, and the bottom cap wafer.

In some embodiments, sidewalls of the cavity may be formed by the dielectric layer and the bonding substrate, and an end of the cavity may be formed by the bottom cap wafer.

In some embodiments, at least one edge of the bottom electrode may be disposed within the cavity.

In some embodiments, a vertical projection of at least one edge of the top electrode may be disposed within the cavity.

In some embodiments, the FBAR structure may further include at least one of a top raised structure disposed above the top electrode and along an edge of the top electrode, or a bottom raised structure disposed below the bottom electrode and along an edge of the bottom electrode.

In some embodiments, the FBAR structure may further include a top passivation layer disposed above the top electrode, and a bottom passivation layer disposed below the bottom electrode.

In some embodiments, each one of the top passivation layer and the bottom passivation layer may include silicon nitride (SiN), aluminum nitride (AlN), silicon oxide ($SiO_2$), silicon oxynitride (SiNO), or a stacked combination of two or more of these materials.

In some embodiments, the FBAR structure may further include a bottom electrode contact layer disposed above the piezoelectric layer and electrically connected with the bottom electrode via a bottom electrode contact window formed in the piezoelectric layer, and a top electrode contact layer disposed above the top passivation layer and electrically connected with the top electrode via a top electrode contact window formed in the top passivation layer.

In some embodiments, each one of the bottom electrode contact layer and the top electrode contact layer may include aluminum (Al), copper (Cu), gold (Au), titanium (Ti), tungsten (W), platinum (Pt), or a stacked combination of two or more of those materials.

In some embodiments, the FBAR structure may further include a bonding layer disposed between the bonding substrate and the bottom cap wafer. The bonding substrate may be bonded to the bottom cap wafer via the bonding layer.

In some embodiments, the bonding layer may include a single layer of bonding material.

In some embodiments, the bonding layer may include an opening connected with the cavity.

In some embodiments, the bonding layer may include at least an upper bonding layer and a lower bonding layer.

In some embodiments, the upper bonding layer may include an opening connected with the cavity.

In some embodiments, the bonding layer may include silicon oxide, silicon nitride, ethyl silicate, dry film, or a stacked combination of two or more of those materials.

In some embodiments, the piezoelectric layer may include aluminum nitride (AlN), zinc oxide (ZnO), lithium niobate ($LiNbO_3$), lithium tantalate ($LiTaO_3$), lead zirconate titanate (PZT), barium strontium titanate (BST), or a stacked combination of two or more of those materials.

In some embodiments, the top electrode and the bottom electrode include molybdenum (Mo), aluminum (Al), copper (Cu), platinum (Pt), tantalum (Ta), tungsten (W), palladium (Pd), ruthenium (Ru), or a stacked combination of two or more of those materials.

In some embodiments, the dielectric layer may include pure silicon oxide, phosphor silicate glass (PSG), or boron phosphor silicate glass (BPSG).

In some embodiments, the bonding substrate may include silicon (Si).

In some embodiments, the bottom cap wafer includes silicon (Si), silicon carbide (SiC), sapphire ($Al_2O_3$), or a stacked combination of two or more of those materials.

Embodiments of the present disclosure also provide a method for forming a film bulk acoustic resonator (FBAR) structure. The method may include: sequentially forming a top electrode layer, a piezoelectric layer, and a bottom electrode layer on a first substrate; patterning the bottom electrode layer to form a bottom electrode; forming a dielectric layer on the bottom electrode; bonding a bonding substrate onto the dielectric layer; removing the first substrate; patterning the top electrode layer to form a top electrode; forming an opening in the bonding substrate; selectively removing a portion of the dielectric layer to form a cavity; and bonding a bottom cap wafer onto the bonding substrate to seal the cavity.

In some embodiments, the method may further include forming a bottom frame layer on the bottom electrode layer before patterning the bottom electrode layer to form the bottom electrode.

In some embodiments, the method may further include patterning the bottom frame layer while patterning the bottom electrode layer, to form a bottom raised structure along an edge of the bottom electrode.

In some embodiments, the method may further include forming a top frame layer on the top electrode layer before patterning the top electrode layer to form the top electrode.

In some embodiments, the method may further include patterning the top frame layer while patterning the top electrode layer, to form a top raised structure along an edge of the top electrode.

In some embodiments, the method may further include forming a bottom passivation layer on the bottom electrode layer.

In some embodiments, the method may further include forming a top passivation layer on the first substrate before sequentially forming the top electrode layer, a piezoelectric layer, and a bottom electrode material layer on the first substrate.

In some embodiments, the method may further include forming a top electrode contact window in the top passivation layer to expose a portion of the top electrode; and forming a bottom electrode contact window in the piezoelectric layer to expose a portion of the bottom electrode.

In some embodiments, the method may further include: forming a top electrode contact layer that electrically connects to the top electrode via the top electrode contact window; and forming a bottom electrode contact layer that electrically connects to the bottom electrode via the bottom electrode contact window.

In some embodiments, the method may further include, before forming the opening in the bonding substrate: forming a temporary bonding layer on the top electrode; and bonding a temporary bonding carrier onto the temporary bonding layer.

In some embodiments, the method may further include, after bonding the cap wafer onto the bonding substrate, removing the temporary bonding layer and the temporary bonding carrier.

In some embodiments, the method may further include thinning the bonding substrate.

In some embodiments, the method may further include: forming a bonding layer on the bonding substrate; and bonding the bottom cap wafer onto the bonding substrate via the bonding layer.

In some embodiments, the method may further include selectively removing a portion of the bonding layer while forming the cavity.

BRIEF DESCRIPTION OF THE DRAWINGS

The accompanying drawings, which are incorporated in and constitute a part of this application, illustrate disclosed embodiments and, together with the description, serve to explain the disclosed embodiments.

FIG. 1C is a cross-sectional view of a FBAR structure, according to an embodiment of the present disclosure.

DETAILED DESCRIPTION

Figure 1A:
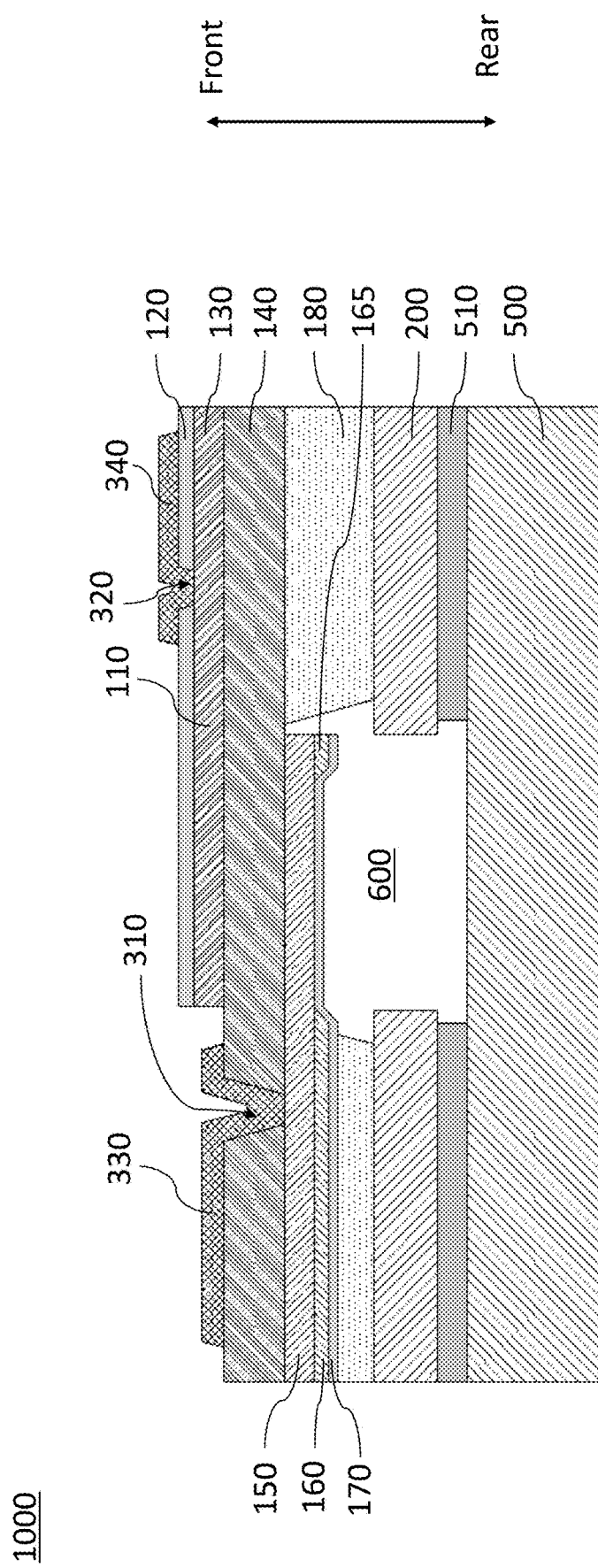
FIG. 1A is a cross-sectional view of a FBAR structure, according to an embodiment of the present disclosure.

The text below provides a detailed description of the present disclosure in conjunction with specific embodiments illustrated in the attached drawings. However, these embodiments do not limit the present disclosure. The scope of protection for the present disclosure covers changes made to the structure, method, or function by persons having ordinary skill in the art on the basis of these embodiments.

To facilitate the presentation of the drawings in the present disclosure, the sizes of certain structures or portions may be enlarged relative to other structures or portions. Therefore, the drawings in the present disclosure are only for the purpose of illustrating the basic structure of the subject matter of the present disclosure. The same numbers in different drawings represent the same or similar elements unless otherwise represented.

Additionally, terms in the text indicating relative spatial position, such as "front," "rear," "upper," "lower," "above," "below," and so forth, are used for explanatory purposes in describing the relationship between a unit or feature depicted in a drawing and another unit or feature therein. Terms indicating relative spatial position may refer to positions other than those depicted in the drawings when a device is being used or operated. For example, if a device shown in a drawing is flipped over, a unit which is described as being positioned "below" or "under" another unit or feature will be located "above" the other unit or feature. Therefore, the illustrative term "below" may include positions both above and below. A device may be oriented in other ways (e.g., rotated 90 degrees or facing another direction), and descriptive terms that appear in the text and are related to space should be interpreted accordingly. When a component or layer is said to be "above" another member or layer or "connected to" another member or layer, it may be directly above the other member or layer or directly connected to the other member or layer, or there may be an intermediate component or layer.

FIG. 1A is a cross-sectional view of a film bulk acoustic resonator (FBAR) structure 1000, according to an embodiment of the present disclosure. As illustrated in FIG. 1, FBAR structure 1000 includes a top electrode 130, a piezoelectric layer 140 disposed below top electrode 130, and a bottom electrode 150 disposed below piezoelectric layer 140.

In the present disclosure, to facilitate understanding and description, a vertical direction extending from piezoelectric layer 140 toward top electrode 130 is defined as being from the "rear" to the "front"; in contrast, a vertical direction extending from piezoelectric layer 140 toward bottom electrode 150 is defined as being from the "front" to the "rear." Thus, using the terminology defined above, piezoelectric layer 140 is disposed at a rear side of top electrode 130, and bottom electrode 150 is disposed at a rear side of piezoelectric layer 140.

Additionally, FBAR structure 1000 includes a dielectric layer 180 disposed at a rear side of bottom electrode 150, a bonding substrate 200 disposed at a rear side of dielectric layer 180, a bottom cap wafer 500 disposed at a rear side of bonding substrate 200, and a cavity 600 disposed at a rear side of bottom electrode 150 and formed by dielectric layer 180, bonding substrate 200, and bottom cap wafer 500. Sidewalls of cavity 600 are formed by dielectric layer 180 and bonding substrate 200. A rear end of cavity 600 is formed by bottom cap wafer 500.

At least one edge of bottom electrode 150 is disposed within cavity 600. Additionally, a vertical projection of at least one edge of top electrode 130 is disposed within cavity 600. As a result, the vertical overlap of top and bottom electrodes 130 and 150 in a non-effective resonator function area (i.e., an area outside of cavity 600) is minimized, and thus parasitic capacitance is minimized.

Bottom cap wafer 500 may include a material such as, for example, silicon (Si), silicon carbon (SiC), aluminum oxide, quartz, glass (SiO$_2$), or sapphire (Al$_2$O$_3$).

Piezoelectric layer 140 may include a material with piezoelectric properties such as, for example, aluminum nitride (AlN), scandium doped aluminum nitride (ScAlN), zinc oxide (ZnO), lithium niobate (LiNbO$_3$), lithium tantalate (LiTaO$_3$), lead zirconate titanate (PZT), barium strontium titanate (BST), etc., or a stacked combination of two or more of these materials. When the material of piezoelectric layer 140 is aluminum nitride (AlN), the aluminum nitride may be doped with a certain proportion of rare earth elements, for example, scandium, erbium, lanthanum, etc.

Top and bottom electrodes 130 and 150 may include any suitable conductive material, including various metal materials with conductive properties such as molybdenum (Mo), aluminum (Al), copper (Cu), platinum (Pt), tantalum (Ta), tungsten (W), palladium (Pd), ruthenium (Ru), etc., or a stacked combination of two or more of these conductive metal materials.

As illustrated in FIG. 1A, FBAR structure 1000 further includes a bonding layer 510 disposed between bonding substrate 200 and bottom cap wafer 500 for bonding substrate 200 with bottom cap wafer 500. An opening is formed in bonding layer 200. The opening is connected with cavity 600. Thus, sidewalls of cavity 600 are also formed by bonding layer 200.

As illustrated in FIG. 1A, a bottom frame layer 160 is disposed on at least a portion of a rear surface of bottom electrode 150. Bottom frame layer 160 is used to form a bottom raised structure 165 along at least one edge of a resonator electrode (i.e., bottom electrode 150 in the present embodiment). Bottom raised structure 165 protrudes towards cavity 600. Bottom frame layer 160 may include a conductive material, which may be the same as the material of bottom electrode 150 or may be different from the material of bottom electrode 150.

A top passivation layer 120 is disposed at a front side, and covers a front surface of, top electrode 130. A bottom passivation layer 170 is disposed at a rear side, and covers rear surfaces of, bottom electrode 150 and bottom frame layer 160. Top passivation layer 120 may include aluminum nitride (AlN). Bottom passivation layer 170 may include a material such as silicon nitride (SiN), aluminum nitride (AlN), silicon oxide (SiO$_2$), silicon oxynitride (SiNO), etc., or a stacked combination of two or more of those materials.

Top passivation layer 120 is provided with a top electrode contact window 320 that exposes a portion of top electrode 130. A top electrode contact layer 340 is disposed at a front side of top passivation layer 120 and is electrically connected to top electrode 130 via top electrode contact window 320. Top electrode contact layer 340 includes leads and pads for top electrode 130. Piezoelectric layer 140 is provided with a bottom electrode contact window 310 that exposes a portion of bottom electrode 150. A bottom electrode contact layer 330 is disposed at a front side of piezoelectric layer 140 and is electrically connected to bottom electrode 150 via bottom electrode contact window 310. Bottom electrode contact layer 330 includes leads and pads for bottom electrode 150. Top electrode contact layer 340 and bottom electrode contact layer 330 may include various metals, such as aluminum (Al), copper (Cu), gold (Au), titanium (Ti), tungsten (W), platinum (Pt), etc., or a stacked combination of two or more of those metals.

Figure 1B:
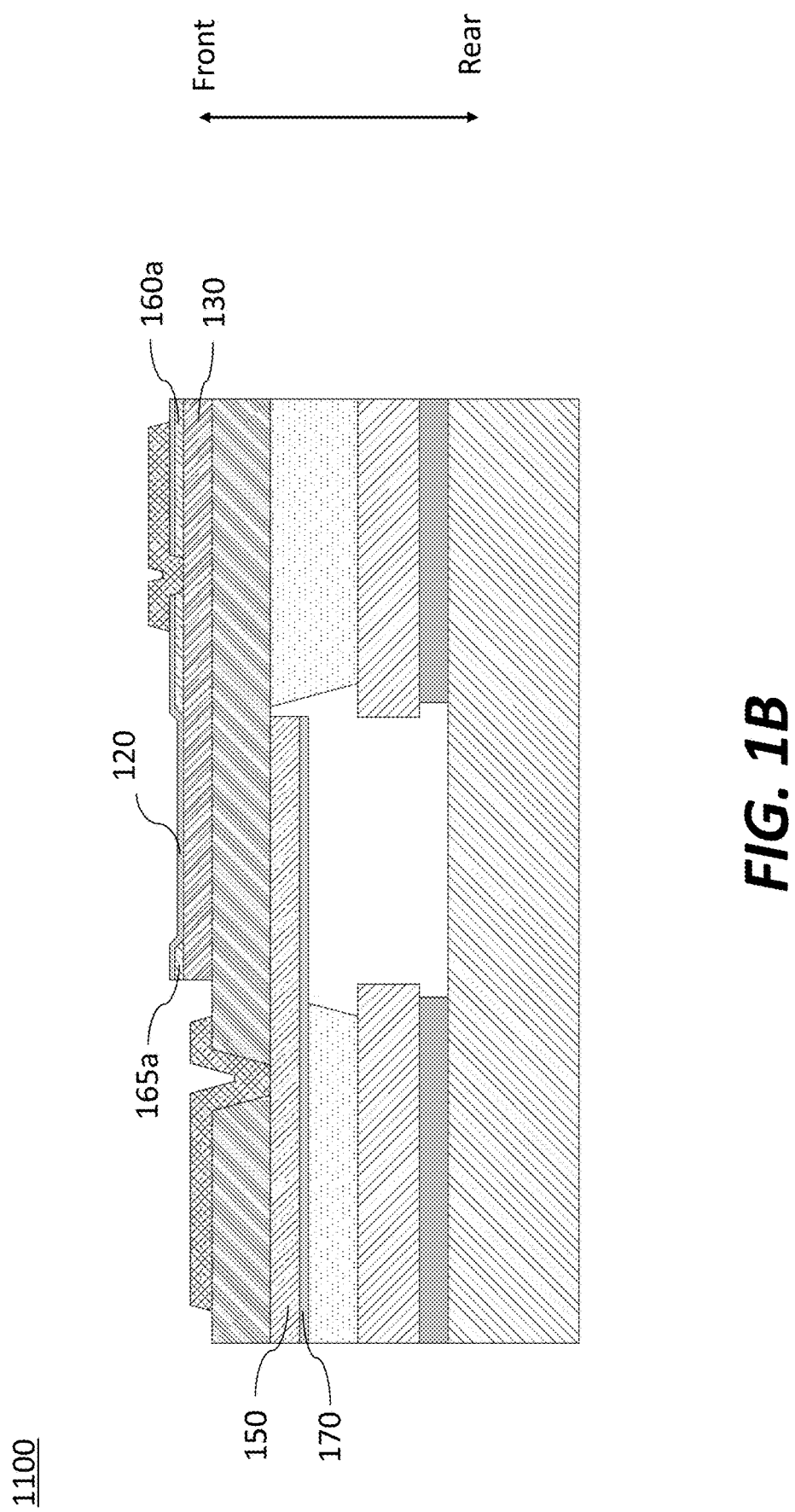
FIG. 1B is a cross-sectional view of a FBAR structure, according to an embodiment of the present disclosure.

FIG. 1B is a cross-sectional view of a FBAR structure 1100, according to an embodiment of the present disclosure. FBAR structure 1100 differs from FBAR structure 1000 in that there is no bottom frame layer 160 and bottom raised structure 165 formed at the rear side of bottom electrode 150. Instead, FBAR structure 1100 includes a top frame layer 160a disposed on at least a portion of a front surface of top electrode 130, to form a top raised structure 165a along at least one edge of top electrode 130. The raised structure protrudes from top electrode 130 in a direction away from bottom electrode 150. In FBAR structure 1100, bottom passivation layer 170 covers the rear surface of bottom electrode 150.

Except for top frame layer 160a and top raised structure 165a, the components of FBAR structure 1100 are the same as the components of FBAR structure 1000, and therefore detailed descriptions of these components are not repeated.

FIG. 1C is a cross-sectional view of a FBAR structure 1200, according to an embodiment of the present disclosure. FBAR structure 1200 differs from FBAR structure 1000 in that FBAR structure 1200 includes both of bottom frame layer 160 for forming bottom raised structure 165 along at least one edge of bottom electrode 150, and top frame layer 160a for forming top raised structure 165a along at least one edge of top electrode 130.

Except for top and bottom frame layers 160a and 160 and top and bottom raised structure 165a and 165, the components of FBAR structure 1200 are the same as the components of FBAR structure 1000, and therefore detailed descriptions of these components are not repeated.

Figure 1D:
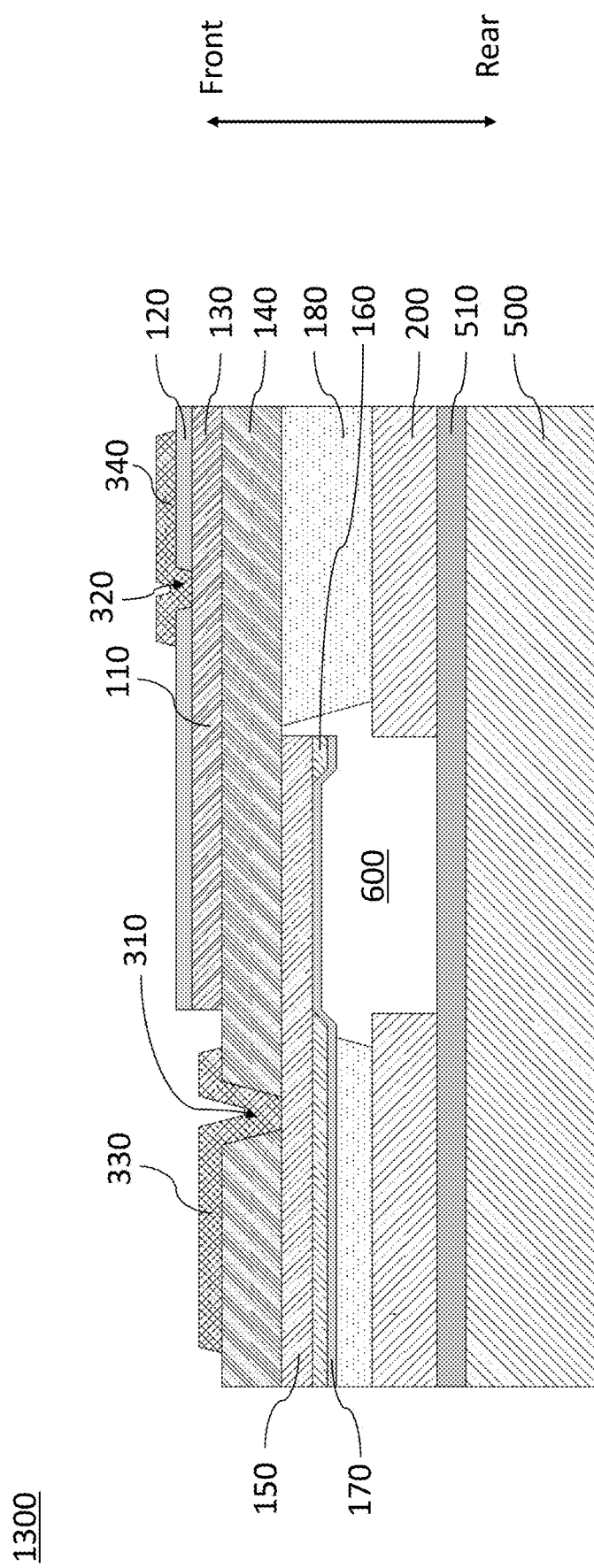
FIG. 1D is a cross-sectional view of a FBAR structure, according to an embodiment of the present disclosure.

FIG. 1D is a cross-sectional view of a FBAR structure 1300, according to an embodiment of the present disclosure. FBAR structure 1300 differs from FBAR structure 1000 in that bonding layer 510 of FBAR structure 1300 do not have an opening. Thus, the rear end of cavity 600 is formed by bonding layer 510.

Except for the opening in bonding layer 510, the components of FBAR structure 1300 are the same as the components of FBAR structure 1000, and therefore detailed descriptions of these components are not repeated.

Figure 1E:
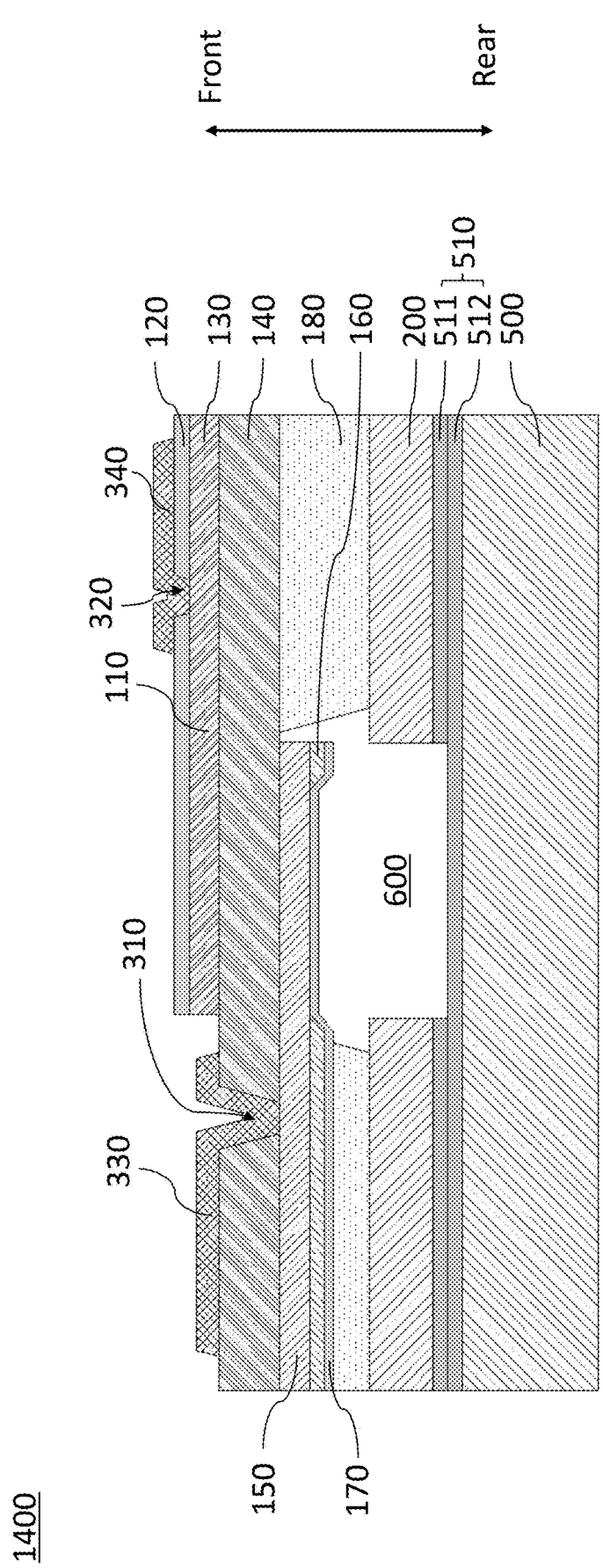
FIG. 1E is a cross-sectional view of a FBAR structure, according to an embodiment of the present disclosure.

FIG. 1E is a cross-sectional view of a FBAR structure 1400, according to an embodiment of the present disclosure. FBAR structure 1400 differs from FBAR structure 1000 in that bonding layer 510 of FBAR structure 1400 includes a top bonding layer 511 and a bottom bonding layer 512. Top bonding layer 511 is disposed at a rear side of bonding substrate 200, and covers a rear surface of bonding substrate 200. Bottom bonding layer 512 is disposed at a front side of bottom cap wafer 500, and covers a front surface of bottom cap wafer 500. Bottom cap wafer 500 is bonded to bonding substrate 200 by bonding top bonding layer 511 and bottom bonding layer 512. An opening is formed in top bonding layer 511, and the opening is connected with cavity 600. No opening is formed in bottom bonding layer 512. Thus, top bonding layer 511 forms a portion of the sidewalls of cavity 600. The rear end of cavity 600 is formed by bottom bonding layer 512.

Except for top and bottom bonding layers 511 and 512, the components of FBAR structure 1400 are the same as the components of FBAR structure 1000, and therefore detailed descriptions of these components are not repeated.

Figure 2:
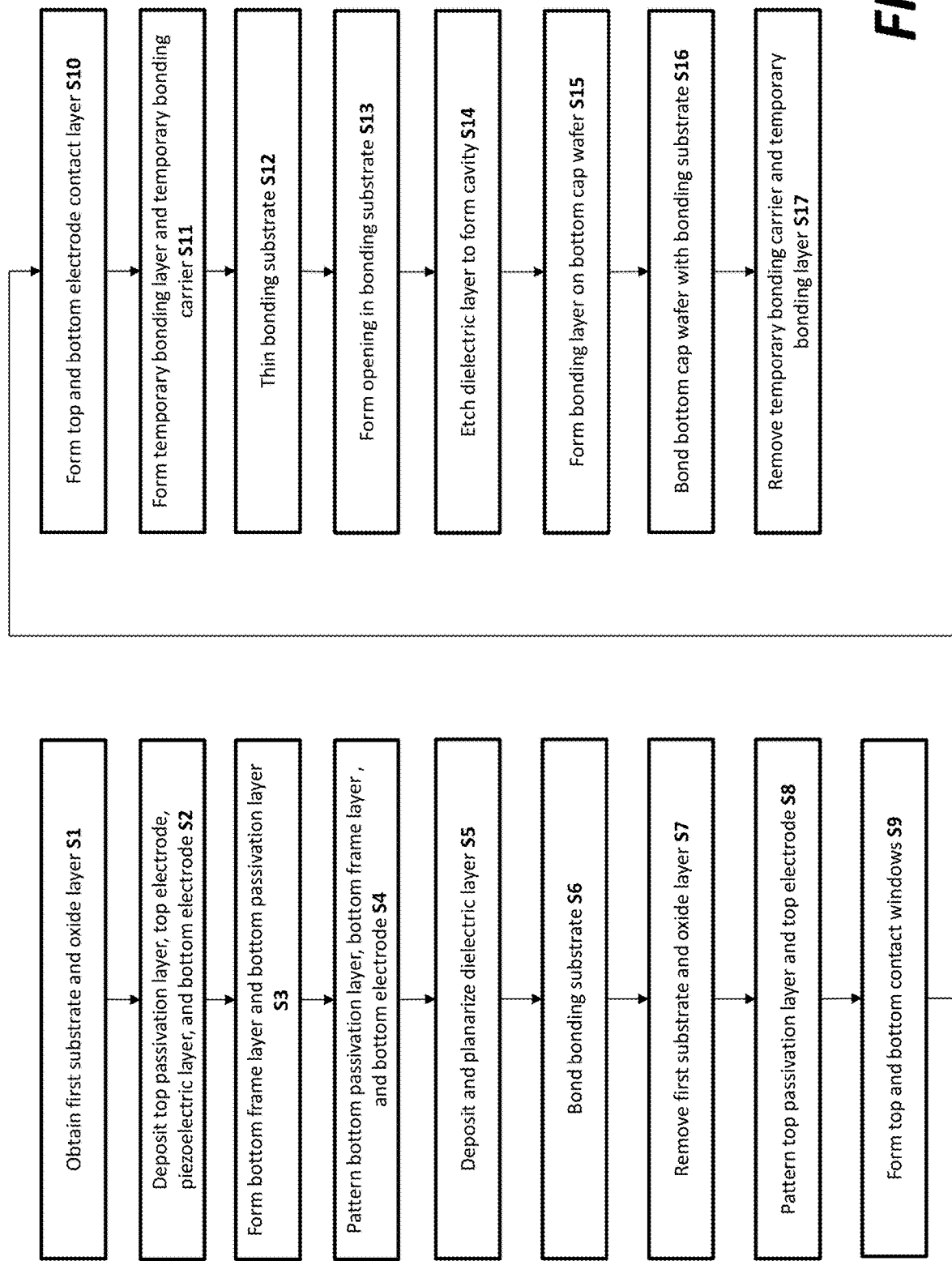
FIG. 2 is a flow chart of a process of fabricating a FBAR structure, according to an embodiment of the present invention.

FIG. 2 is a flow chart of a process of fabricating a FBAR structure according to an embodiment of the present disclosure. FIGS. 3-19 are cross-sectional views of structures formed in steps S1-S17 of the process of FIG. 2, according to an embodiment of the present disclosure.

Figure 3:
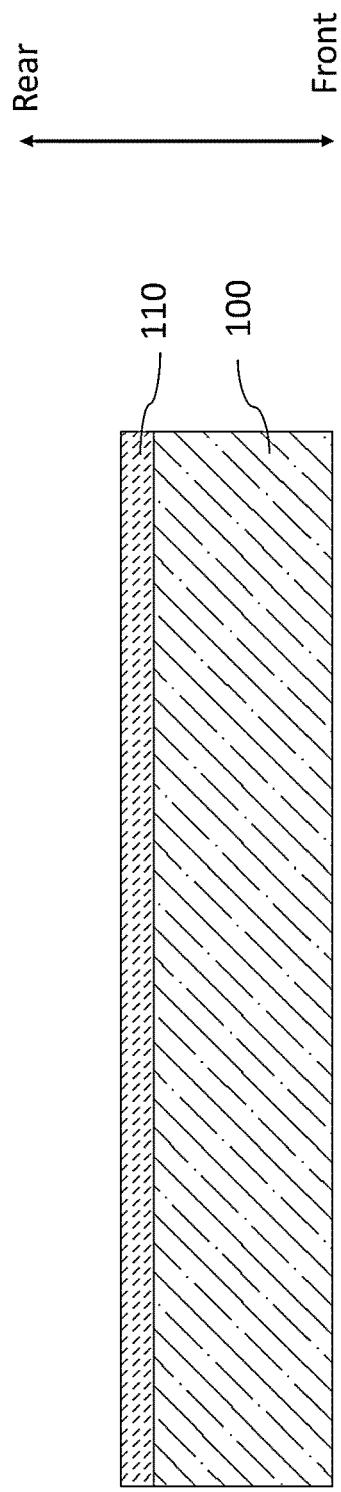
FIGS. 3-19 are cross-sectional views of structures formed in the process of FIG. 2, according to an embodiment of the present disclosure.

As illustrated in FIG. 3, in step S1, a substrate 100 is obtained, and an oxide layer 110 is formed on a surface of substrate 100. The material of substrate 100 may be silicon (Si), silicon carbide (SiC), or sapphire ($Al_2O_3$). The material of oxide layer 110 is silicon oxide ($SiO_2$). A direction extending from substrate 100 toward oxide layer 110 is from the "front" to the "rear" of the FBAR structure to be fabricated.

Figure 4:
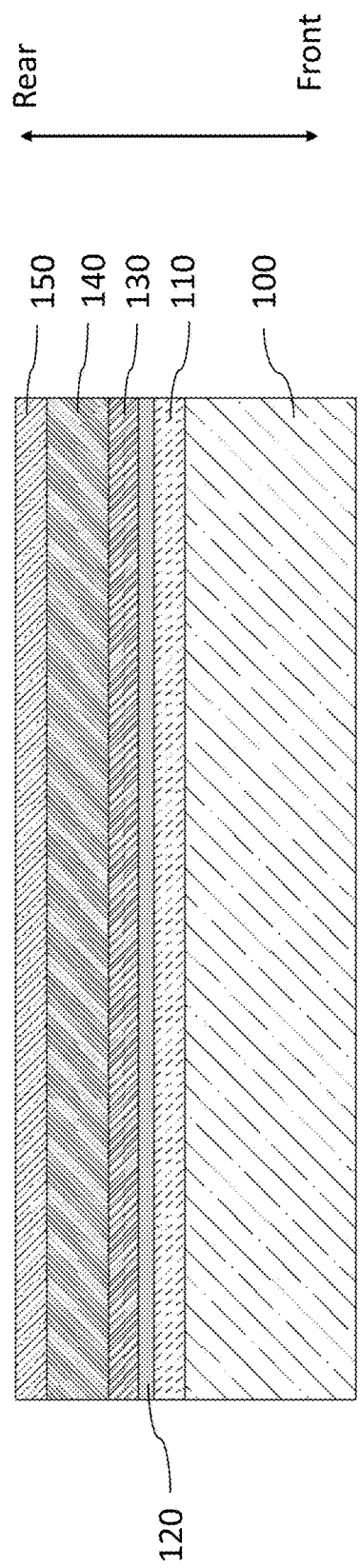

As illustrated in FIG. 4, in step S2, top passivation layer 120, top electrode layer 130, piezoelectric layer 140, and bottom electrode layer 150 are sequentially deposited on oxide layer 110. Top passivation layer 120 may include aluminum nitride (AlN). Top and bottom electrode layers 130 and 150 may include any suitable conductive material, such as various metal materials with conductive properties or a stack of several conductive metal materials, such as molybdenum (Mo), aluminum (Al), copper (Cu), platinum (Pt), tantalum (Ta), tungsten (W), palladium (Pd), ruthenium (Ru), etc. In the present embodiment, top and bottom electrode layers 130 and 150 include molybdenum (Mo). Piezoelectric layer 140 may include materials with piezoelectric properties or their stacked combination, such as aluminum nitride (AlN), zinc oxide (ZnO), lithium niobate ($LiNbO_3$), lithium tantalate ($LiTaO_3$), lead zirconate titanate (PZT), barium strontium titanate (BST), etc. When the material of piezoelectric layer 140 is aluminum nitride (AlN), the aluminum nitride itself may also be doped with a certain proportion of rare earth elements, such as scandium, erbium, lanthanum, etc. In the present embodiment, the material of the piezoelectric layer 140 includes aluminum nitride (AlN) or scandium doped aluminum nitride (ScAlN).

Figure 5:
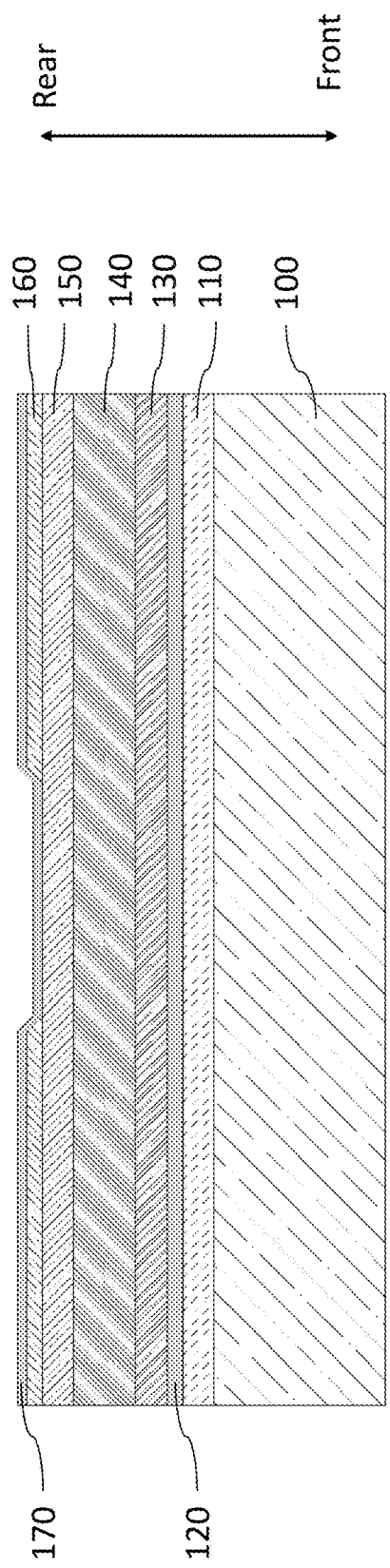

As illustrated in FIG. 5, in step S3, bottom frame layer 160 is formed on a rear side of bottom electrode layer 150. Then, bottom frame layer 160 is patterned to expose a portion of a rear surface of bottom electrode layer 150. Bottom frame layer 160 may include a conductive material, which may be the same as the material of bottom electrode layer 150 or may be different from the material of bottom electrode layer 150. The patterning of bottom frame layer 160 may be obtained either by using a Lift-off process or by using a patterned etching method.

Additionally, in step S3, bottom passivation layer 170 is deposited on the exposed rear surface of bottom electrode layer 150, and a rear surface of bottom frame layer 160. The material of bottom passivation layer 170 may be silicon nitride (SiN), aluminum nitride (AlN), Silicon oxide ($SiO_2$), silicon oxynitride (SiNO), or other materials, or a stacked combination of two or more of these materials.

Figure 6:
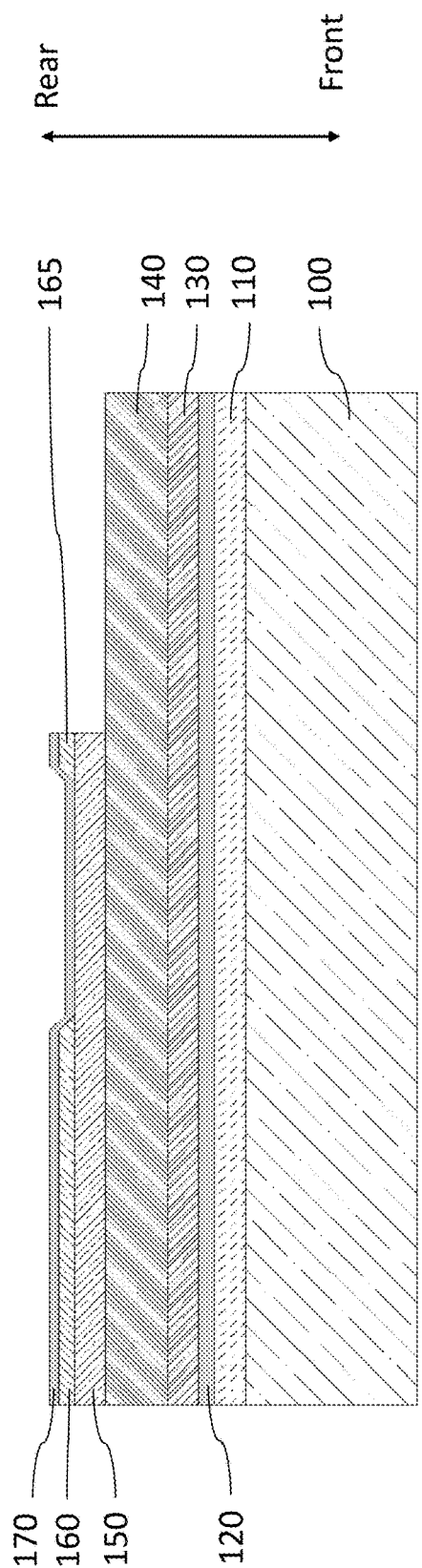

As illustrated in FIG. 6, in step S4, bottom passivation layer 170, bottom frame layer 160, and bottom electrode layer 150 are patterned to form patterned bottom passivation layer 170, patterned bottom frame layer 160, and patterned bottom electrode 150. Patterned bottom frame layer 160 includes bottom raised structure 165 along at least one edge of bottom electrode 150. The patterning may be achieved by etching, such as a plasma etching process, a wet chemical etching process, or a combination of these two processes. As a result of the patterning, an accurate pattern of bottom electrode 150 may be realized.

Figure 7:
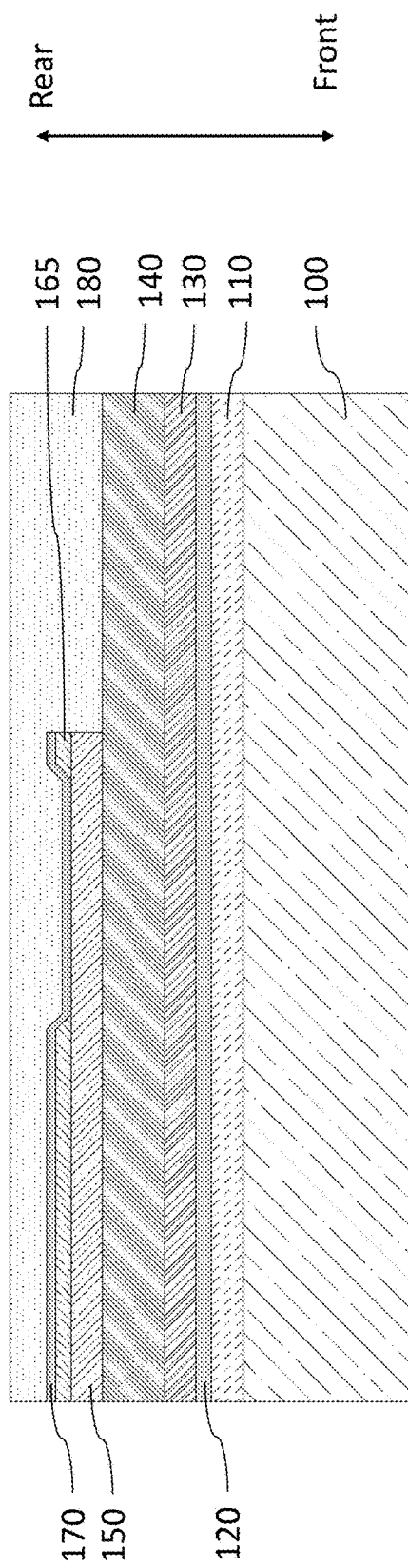

As illustrated in FIG. 7, in step S5, dielectric layer 180 is deposited on a rear side of the structure of FIG. 6. Then, the deposited dielectric layer 180 is planarized. Dielectric layer 180 may include various types of silicon oxide materials, such as pure silicon oxide, phosphor silicate glass (PSG), or boron phosphor silicate glass (BPSG).

Figure 8:
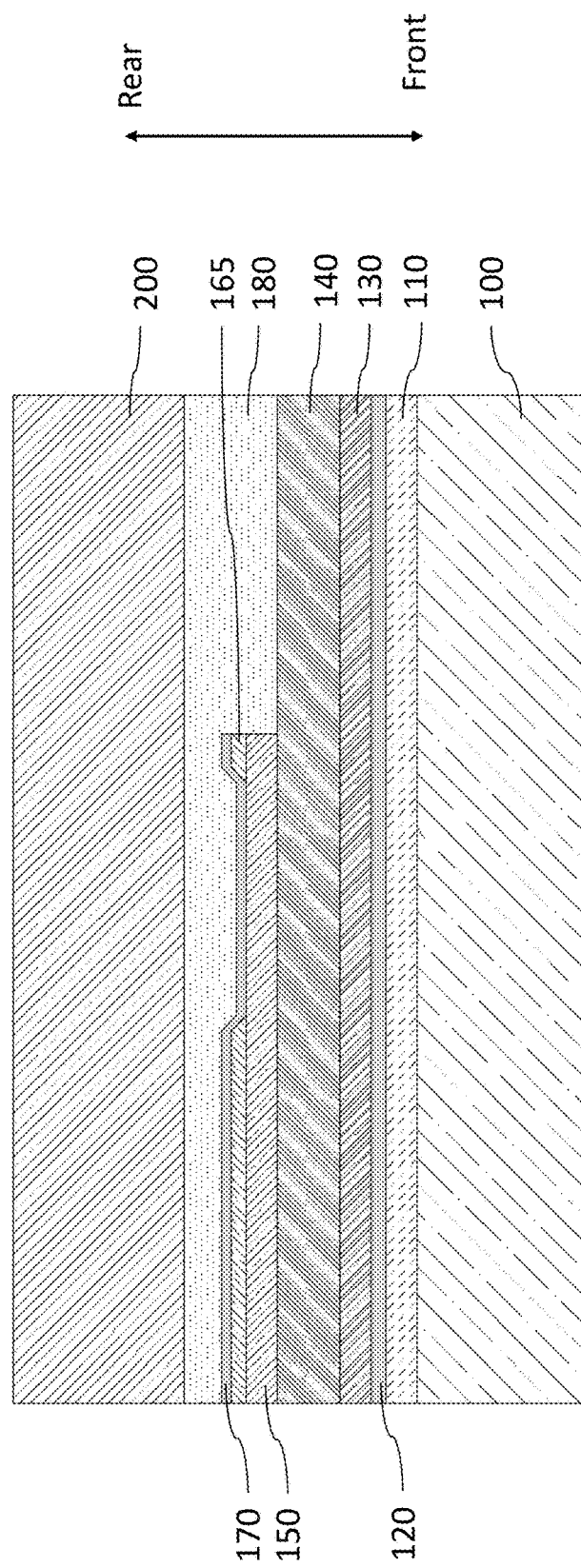

As illustrated in FIG. 8, in step S6, bonding substrate 200 is obtained, and is bonded to dielectric layer 180. Bonding substrate 200 may include silicon (Si). The bonding between dielectric layer 180 and bonding substrate 200 may be realized by a $SiO_2$—Si bonding process.

Figure 9:
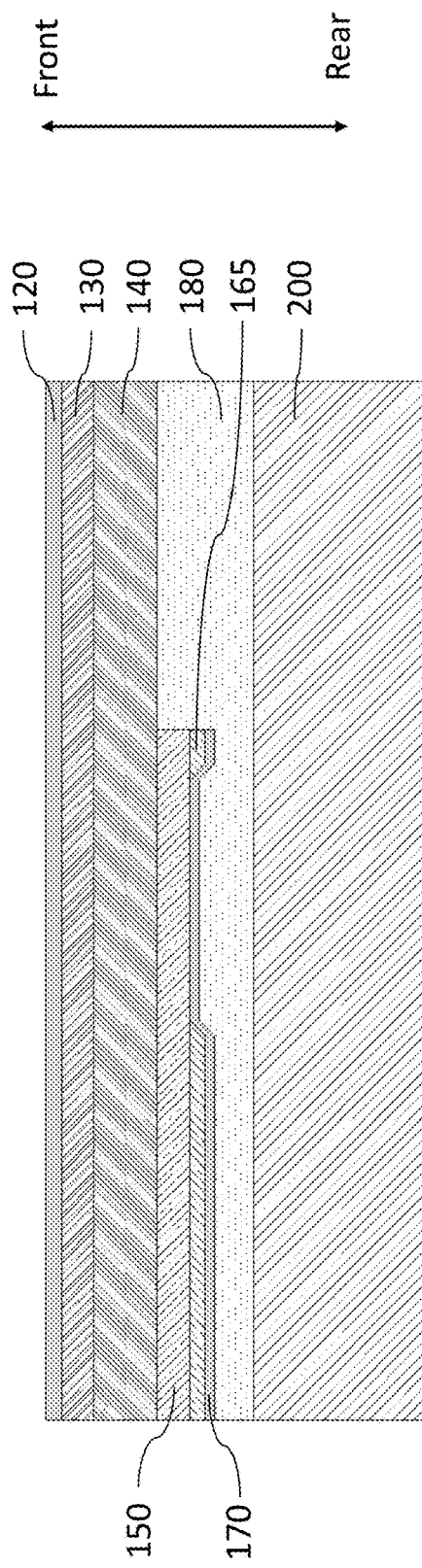

As illustrated in FIG. 9 (which is a flipped-over view of the structure illustrated in FIG. 8), in step S7, substrate 100 and oxide layer 110 are removed. Substrate 100 may be removed by grinding, plasma dry etching, wet chemical etching, or a combination thereof. In the present embodiment, substrate 100 is made of silicon material, and is removed by a combination of grinding and wet chemical etching, or a combination of grinding and plasma dry etching. Oxide layer 110 may be removed by plasma dry etching, wet chemical etching, or a combination thereof.

Figure 10:
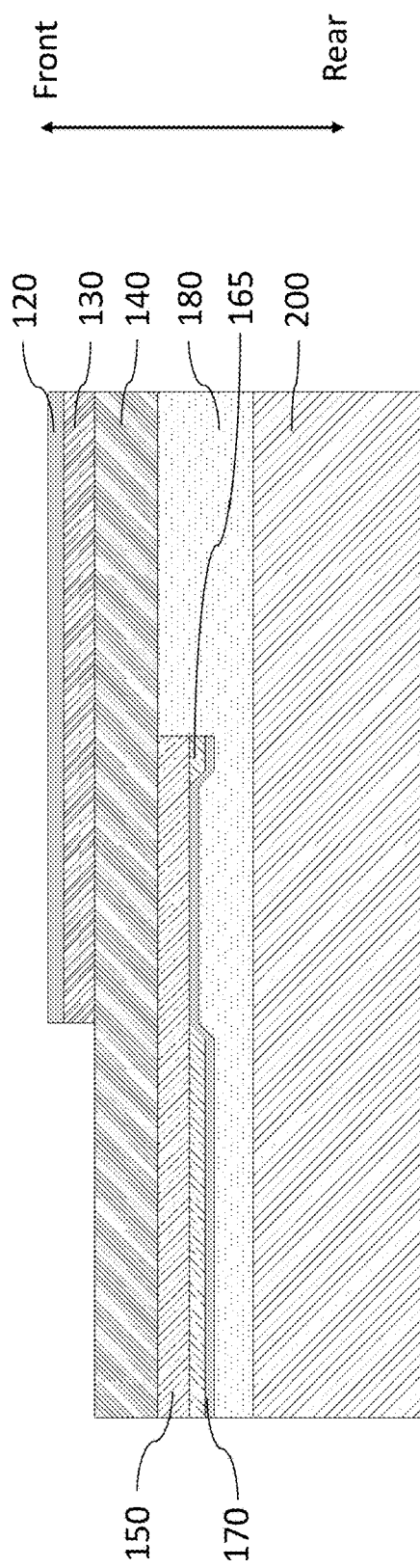

As illustrated in FIG. 10, in step S8, top passivation layer 120 and top electrode layer 130 are patterned by etching, to form patterned top passivation layer 120 and top electrode 130. The etching process may be a plasma etching process, a wet chemical etching process, or a combination thereof. This step allows for precise patterning of top electrode 130. In combination of the precise patterning of bottom electrode 150, parasitic capacitance may be minimized.

Figure 11:
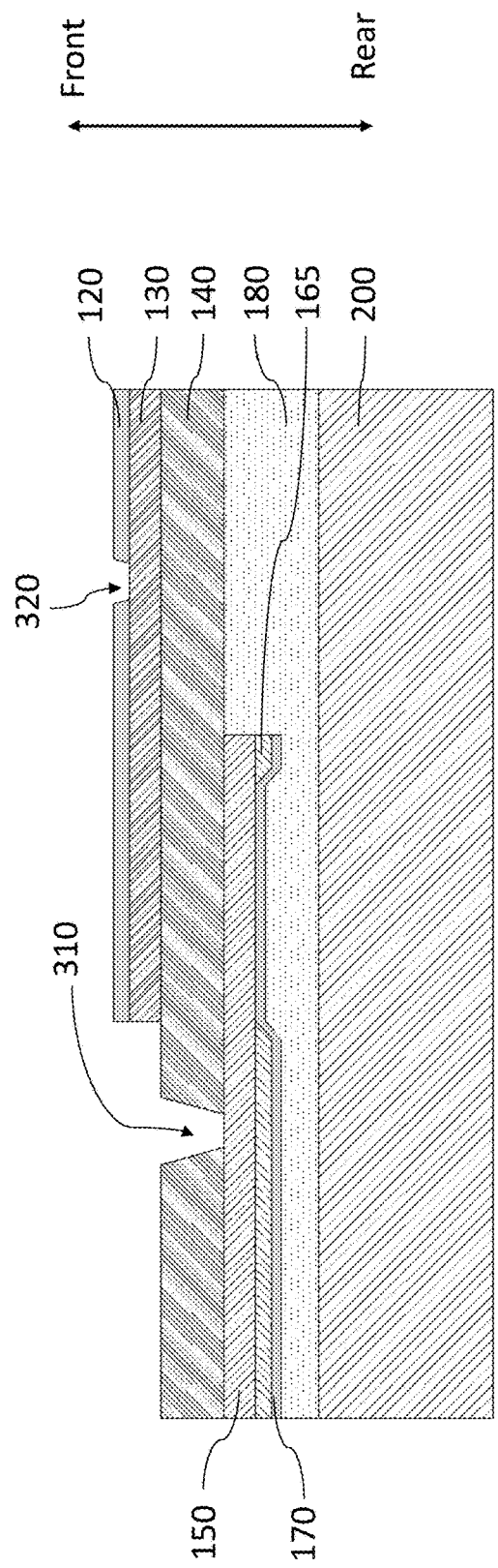

As illustrated in FIG. 11, in step S9, piezoelectric layer 140 is etched to form bottom electrode contact window 310 exposing a front surface of bottom electrode 150. Top passivation layer 120 is etched to form top electrode contact window 320 exposing top electrode 130.

Figure 12:
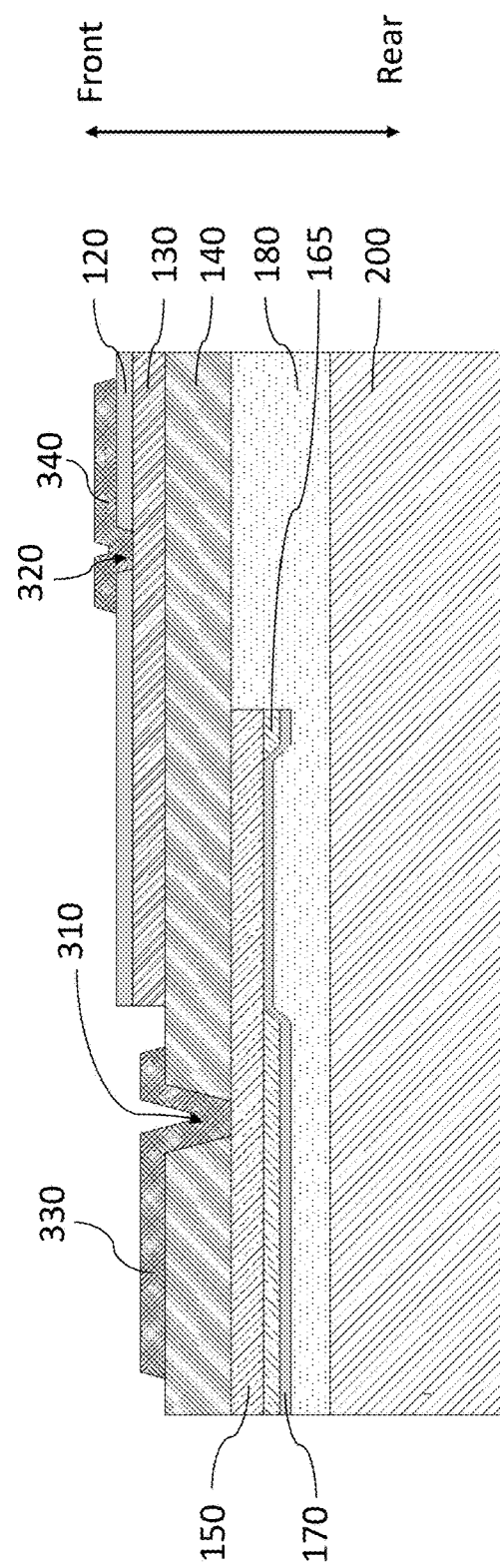

As illustrated in FIG. 12, in step S10, top electrode contact layer 340 and bottom electrode contact layer 330 are formed. Top electrode contact layer 340 and bottom electrode contact layer 330 may include metal materials, such as aluminum (Al), copper (Cu), gold (Au), titanium (Ti), tungsten (W), platinum (Pt), etc., or a stacked combination of two or three of these materials.

Figure 13:
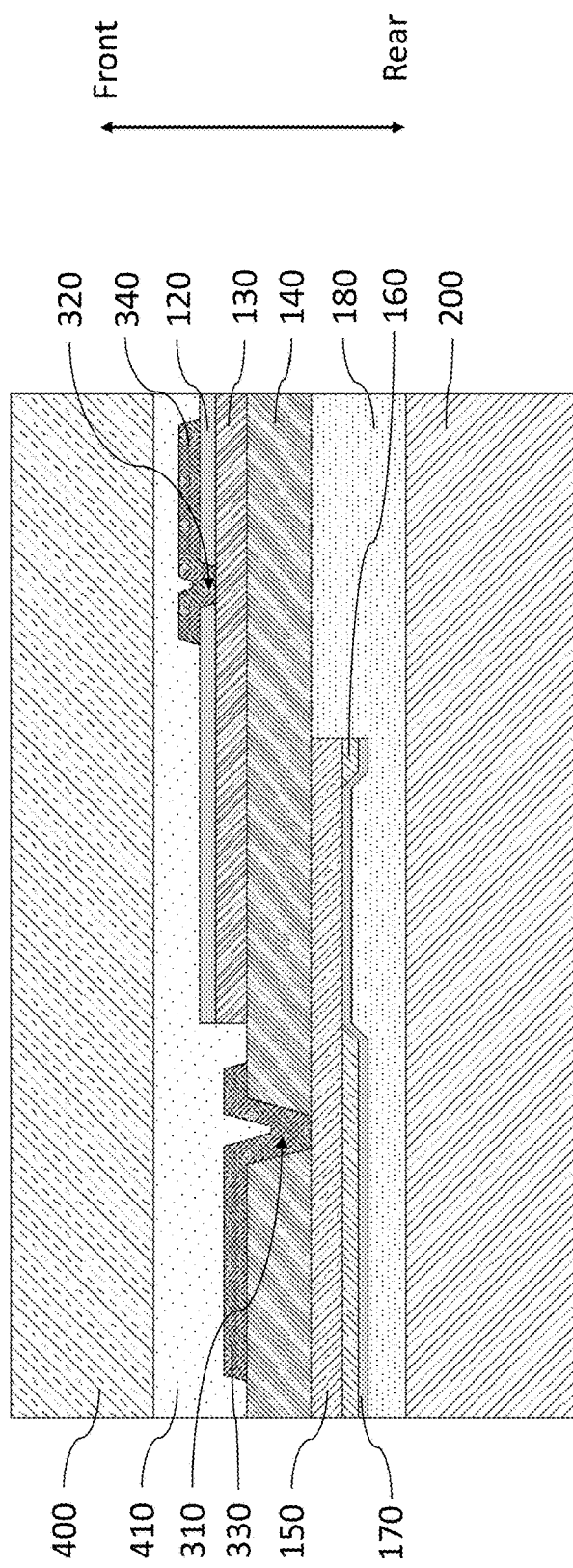

As illustrated in FIG. 13, in step S11, a temporary bonding layer 410 is formed on a front side of the structure of FIG. 12, and a temporary bonding carrier 400 is bonded onto temporary bonding layer 410. Temporary bonding carrier 400 may be a substrate made of a transparent material, such as glass, sapphire, and the like. Temporary bonding carrier 400 provides strength and support for the subsequent process, and will be peeled off after the process is completed. Temporary bonding carrier 400 may be recycled and reused.

Figure 14:
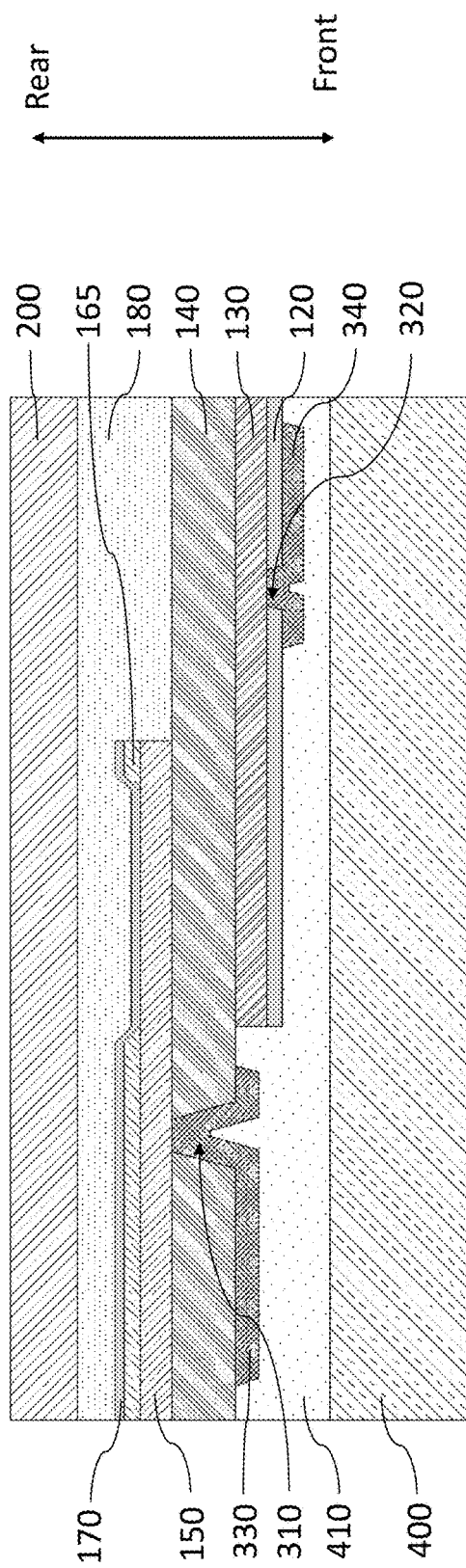

As illustrated in FIG. 14 (which is a flipped-over view of the structure illustrated in FIG. 13), in step S12, bonding substrate 200 is thinned.

Figure 15:
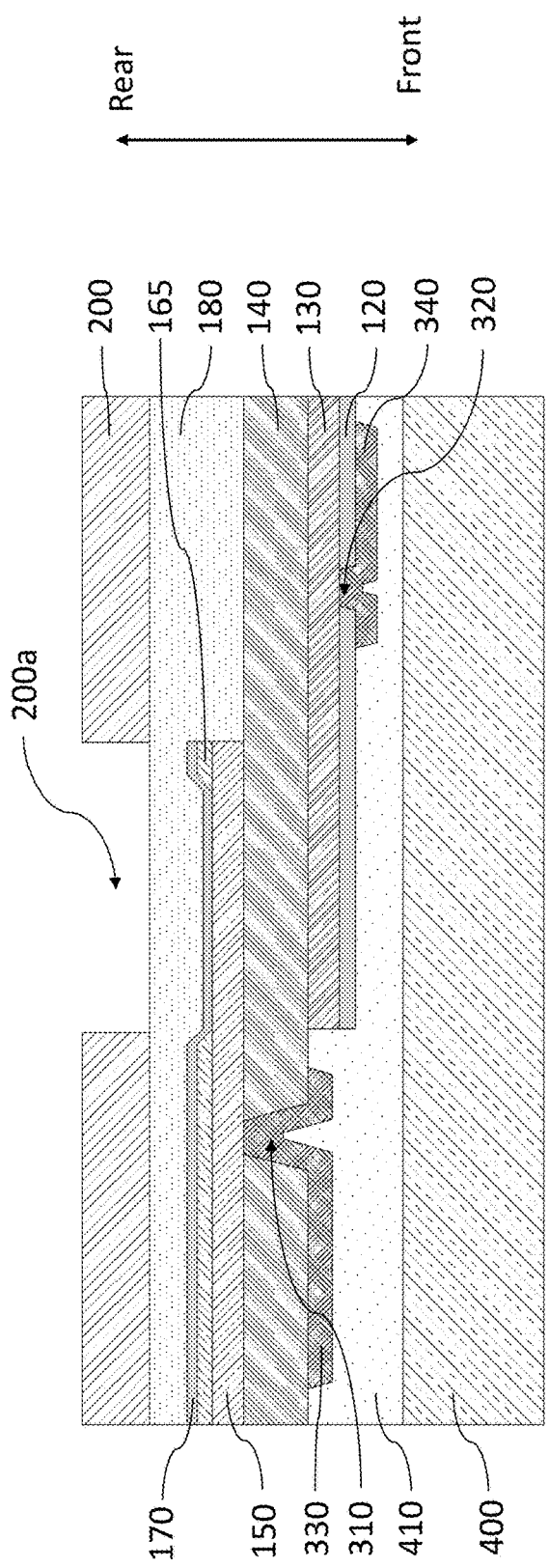

As illustrated in FIG. 15, in step S13, an opening 200a is formed in bonding substrate 200 by, for example, a deep silicon etching process, such as a deep reactive-ion etching (DRIE) process. The etching of bonding substrate 200 stops at dielectric layer 180.

Figure 16:
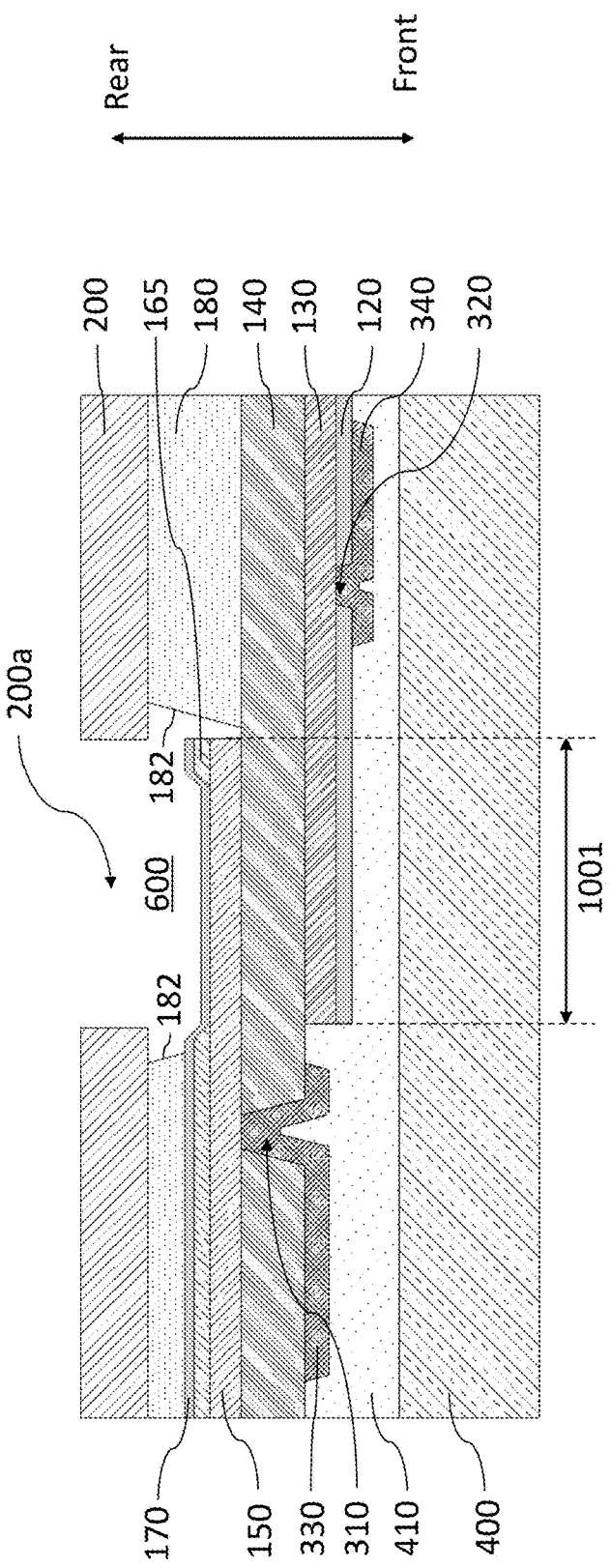

As illustrated in FIG. 16, in step S14, dielectric layer 180 is etched by using bonding substrate 200 formed with opening 200a as an etching mask. As a result, dielectric layer 180 is partially removed, bottom electrode 150 and bottom passivation layer 170 on the rear side of bottom electrode 150 are exposed, and cavity 600 is formed. The etching is performed such that etch stop surfaces 182 of dielectric layer 180 fully expose an effective working area 1001 of the resonator, which is formed by overlapping portions of top electrode 130, piezoelectric layer 140, and bottom electrode 150. In other words, a vertical projection of effective working area 1001 of the resonator is completely placed in cavity 600 formed after the partial removal of dielectric layer 180.

Figure 17:
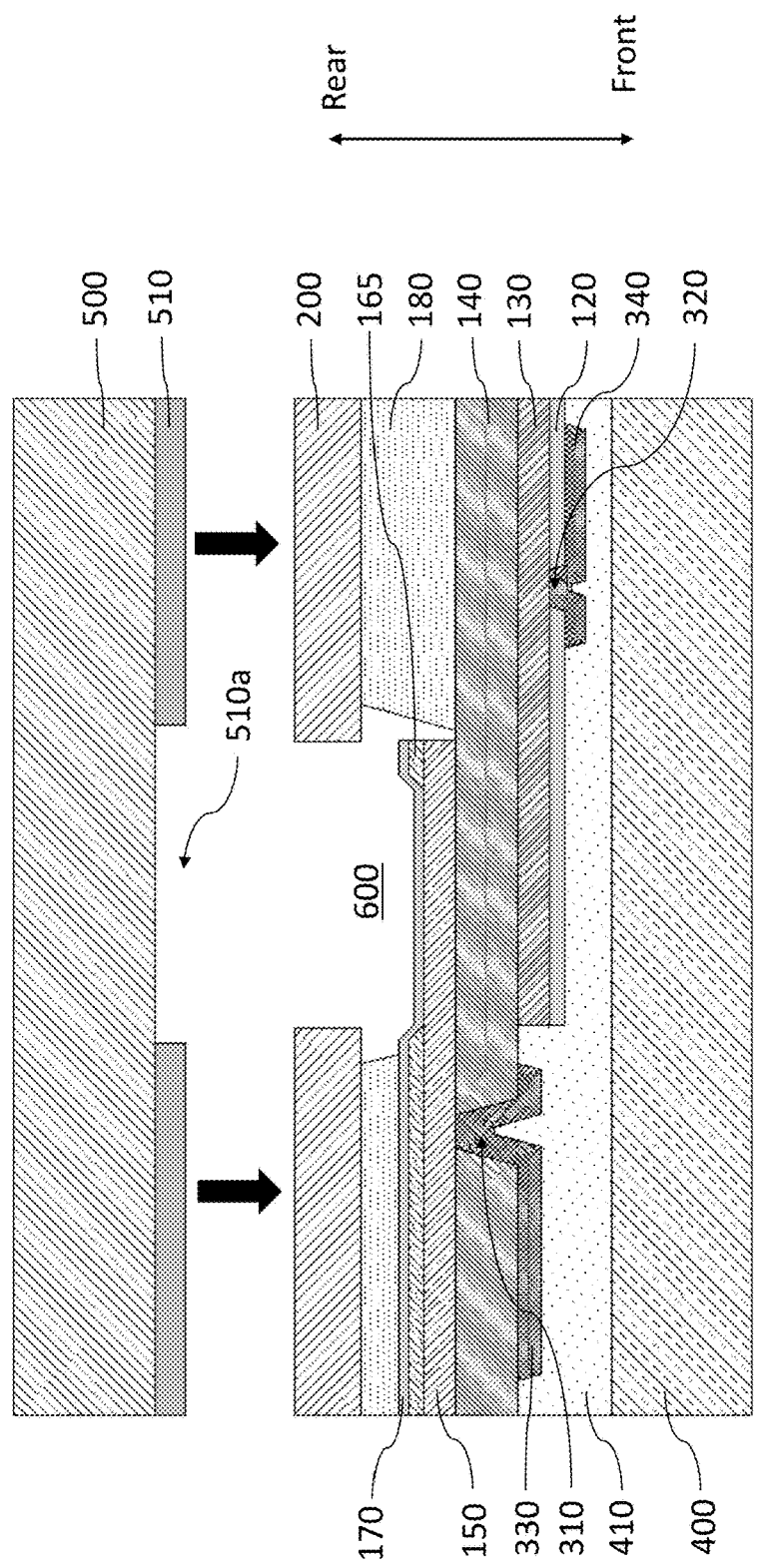

As illustrated in FIG. 17, in step S15, bottom cap wafer 500 is provided, and bonding layer 510 is formed on bottom cap wafer 500. A direction extending from bottom cap wafer 500 to bonding layer 510 is from the "rear" to the "front." An opening 510a is formed in bonding layer 510. The position of opening 510a corresponds to the position of cavity 600. In another embodiment, for example, in FBAR structure 1300 illustrated in FIG. 1D, there is no opening formed in bonding layer 510. Bonding layer 510 may be made of materials such as silicon oxide, silicon nitride, ethyl silicate, dry film, or a stacked combination thereof. In the present embodiment, bonding layer 510 includes a dry film. In another embodiment, for example, in FBAR 1400 illustrated in FIG. 1E, bonding layer 510 may include two or more than two bonding layers. Bottom cap wafer 500 may include a material such as silicon (Si), carbon silicon (SiC), aluminum oxide, quartz, or glass. In the present embodiment, bottom cap wafer 500 is a silicon substrate.

Figure 18:
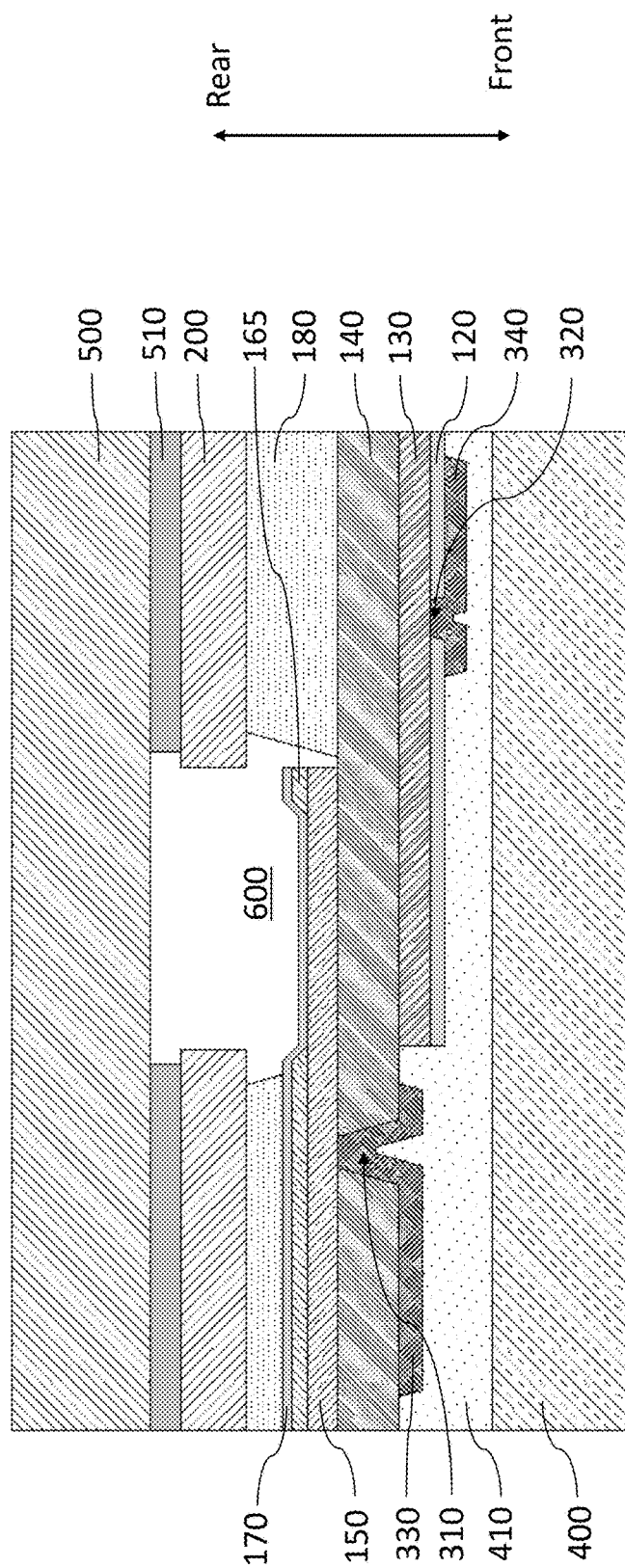

As illustrated in FIG. 18, in step S16, bottom cap wafer 500 is bonded to bonding substrate 200 via bonding layer 510 to form the rear end of cavity 600. Thereby, cavity 600 is closed by bottom cap wafer 500.

Figure 19:
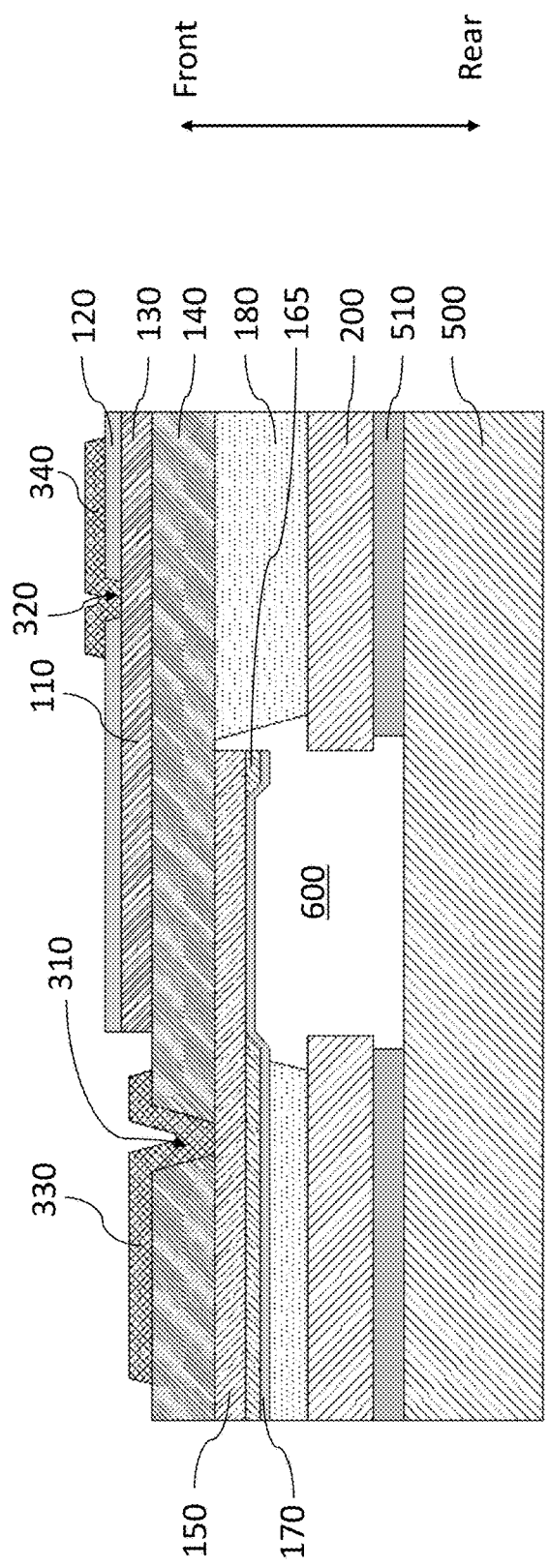

As illustrated in FIG. 19 (which is a flipped-over view of the structure illustrated in FIG. 8), in step S17, temporary bonding layer 410 and temporary bonding carrier 400 are removed. As a result, FBAR structure 1000 illustrated in FIG. 1A is fabricated.

FBAR structures 1000, 1100, 1200, 1300, and 1400 and their fabrication methods according to the embodiments of the present disclosure provide the following advantages.

First, FBAR structures 1000, 1100, 1200, 1300, and 1400 are fabricated using a double-sided manufacturing process. As a result, top and bottom electrodes 130 and 150 can be accurately patterned, which can minimize the parasitic capacitance and improve the quality (Q) factor of the FBAR.

Figure 20:
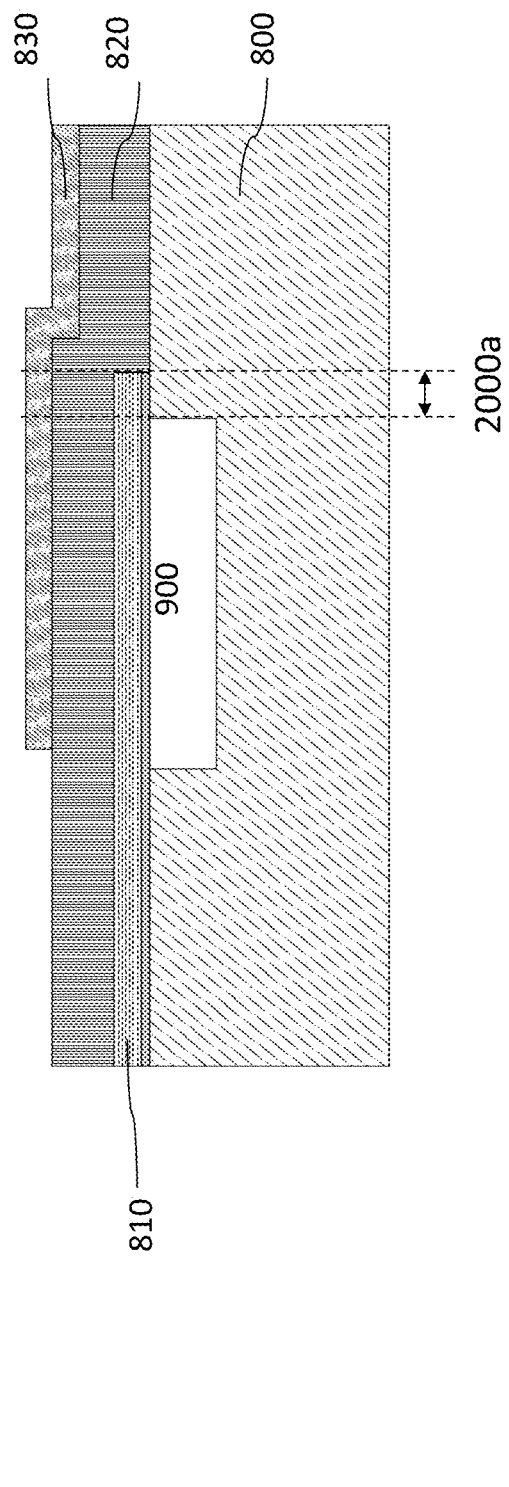
FIG. 20 is a cross-sectional view of a FBAR structure, according to a comparative example.

FIG. 20 is a cross-sectional view of a FBAR structure 2000 according to a comparative example. In FBAR structure 2000 illustrated in FIG. 20, a cavity 900 is first formed in a substrate 800. A bottom electrode 810 is formed above cavity 900, and a portion of bottom electrode 910 is supported by substrate 800, such that bottom electrode 810 extends across the top of cavity 900. A piezoelectric layer 820 and a top electrode 830 are formed above bottom electrode 810. A portion 2000a of bottom electrode 810 supported by substrate 800 overlaps with top electrode 830 in the vertical direction to form overlapping portion 2000a. This overlapping portion 2000a forms a parasitic capacitor, which may undesirably reduce the quality (Q value of the FBAR and the electromechanical coupling coefficient Keff2.

Figure 21:
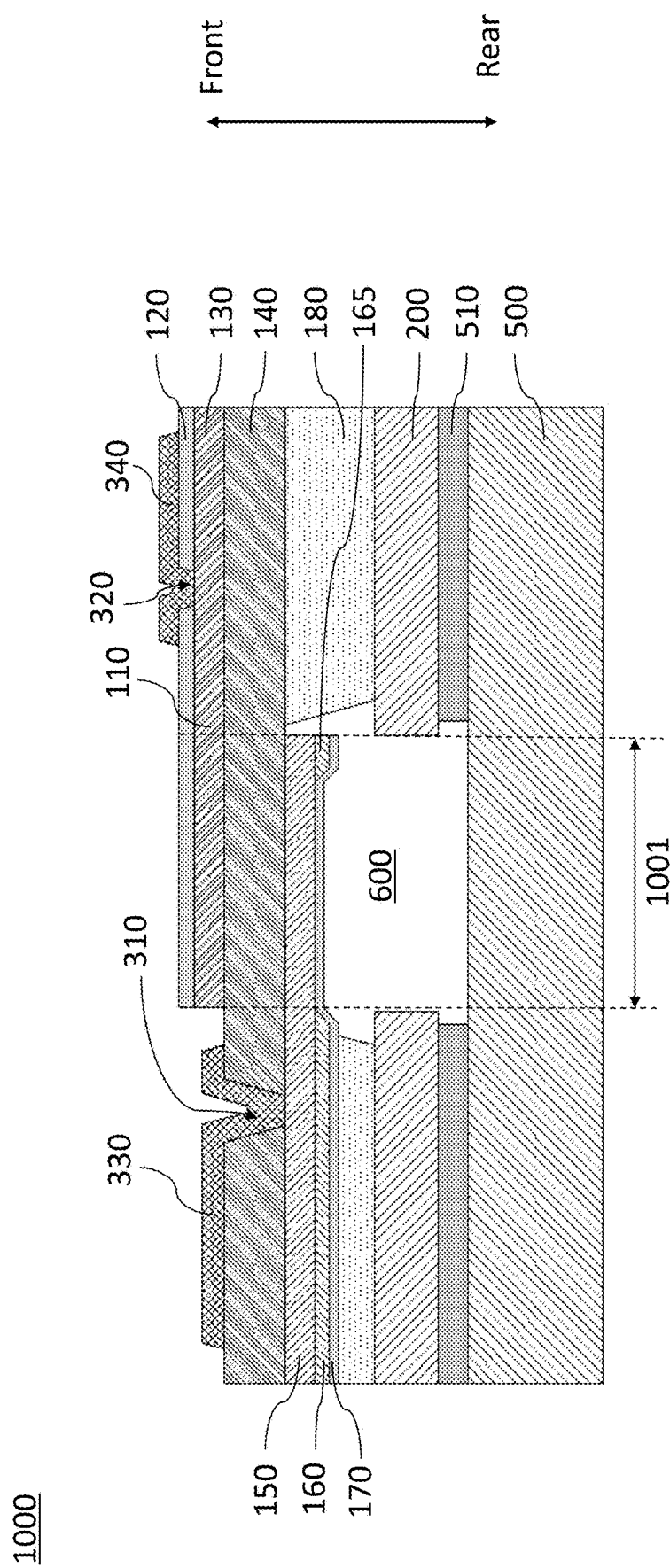
FIG. 21 is a cross-sectional view of a FBAR structure, according to an embodiment of the present disclosure.

On the other hand, as shown in FIG. 21, which is a cross-sectional view of FBAR structure 1000 according to an embodiment of the present disclosure, bottom electrode 150 of effective working area 1001 (the portion of bottom electrode 150 that overlaps with top electrode 130) is positioned in cavity 600, instead of extending across the top of cavity 600. As a result, parasitic capacitance is eliminated, and the Q value of the resonator and the electromechanical coupling coefficient Keff2 are improved.

Figure 22:
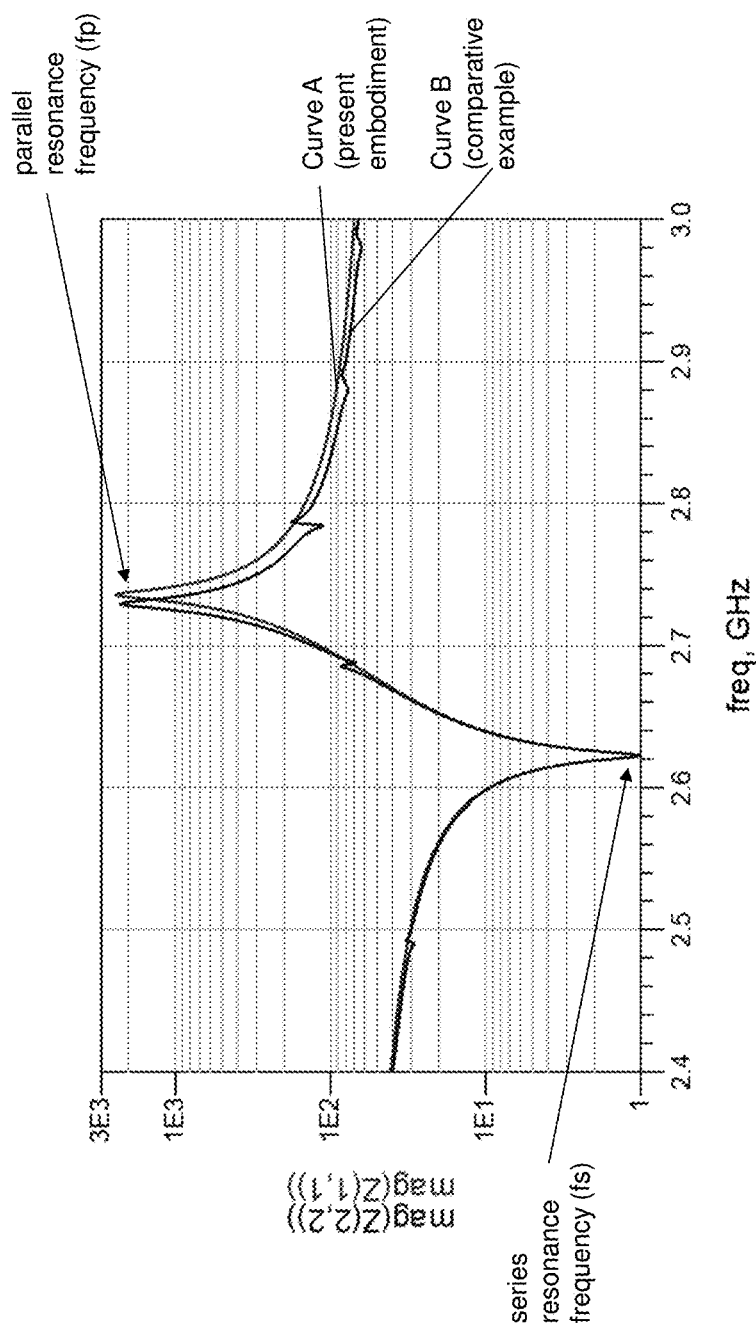
FIG. 22 is a graph showing frequency response curves of a FBAR filter according to an embodiment of the present disclosure and a FBAR filter according to a comparative example.

FIG. 22 is a graph showing a frequency response curve A of a FBAR filter according to an embodiment of the present disclosure, and a frequency response curve B of a FBAR filter according to a comparative example. In the FBAR filter according to the embodiment of the present disclosure (e.g., FBAR structures 1000, 1100, 1200, 1300, and 1400 illustrated in FIGS. 1A-1E), an overlapping portion formed by top and bottom electrodes (e.g., overlapping portion 1001 in FIG. 21) only exists inside the cavity. In the FBAR filter according to the comparative example, the overlapping portion formed by the top and bottom electrodes (e.g., overlapping portion 2000a in FIG. 20) extends outside of the cavity. The overlapping portion that extends outside of the cavity may form multiple resonances, thereby forming multiple stray harmonic responses, which results in the multiple spikes of curve B in FIG. 22. On the other hand, curve A of the embodiment of the present disclosure is smooth without spikes.

Additionally, in the FBAR filter according to the comparative example, the overlapping portion that extends outside of the cavity may leak energy into the FBAR substrate, thereby reducing the Q value of the resonator. As a result, as shown in FIG. 22, the peak of curve A is higher than the peak of curve B. That is, curve A represents a higher Q value.

Furthermore, in the FBAR filter according to the comparative example, the overlapping portion that extends outside of the cavity does not participate in the main resonance of the resonator. Thus, the overlapping portion is regarded as a dummy zone. The capacitance of the overlapping portion increases the parasitic capacitance of the resonator, thereby reducing the keff2 of the resonator. As a result, as shown in FIG. 22, curve A and curve B have the same series resonance frequency (fs), but the parallel resonance frequency (fp) of curve A is significantly higher than that of curve B, which means that curve A represents a higher Keff2.

Moreover, the fabrication methods according to the embodiments of the present disclosure provide the following additional advantages.

According to the embodiments of the present disclosure, a double-sided process is used, in which a structure is processed on one side of a first silicon wafer (e.g., substrate 100), then the first silicon wafer is bonded to a second silicon wafer (e.g., bonding substrate 200) for further processing, and then the first silicon wafer is removed. Therefore, top raised structure 165a and bottom raised structure 165 are formed on the surfaces of top electrode 130 and bottom electrode 150, respectively. Such a structure with both top and bottom raised structures 165a and 165 cannot be fabricated by using traditional fabrication methods. Comparing to a structure with only one raised structure along the edge of a top electrode, the structure with both top and bottom raised structures 165a and 165 can double the performance of the resonator.

According to the embodiments of the present disclosure, cavity 600 is formed by forming, in bonding substrate 200, an opening having an area close to the area of the resonator, and then etching dielectric layer 180 by using bonding substrate 200 formed with the opening as an etching mask. Such fabrication method provides the following advantageous effects:

First, there is no need to form etching release holes in the front side of cavity 600 to release the material of dielectric layer 180 in order to form cavity 600. In other words, there is no etching release hole formed through top electrode 130, piezoelectric layer 140, and bottom electrode 150. As a result, during the subsequent wafer-level packaging process to form a top cavity at the front side of cavity 600, quality and yield problems caused by the leakage of processing chemicals into cavity 600 may be avoided, which brings great convenience in the packaging process. When double organic films are used to form a wafer level package (WLP) cavity as the top cavity (a first organic film forming the cavity wall, and a second organic film forming the cavity roof), the first organic film can be a fluid photoresist organic film formed by spin-coating, instead of a dry film adhesive. The dry film adhesive is usually several times more expensive than the fluid photoresist organic film, and its adhesiveness to the wafer surface is relatively poor. If the first organic film is made of dry film adhesive, the dry film need cover the etching release holes to ensure that chemicals do not leak into cavity 600, which undesirably limits the wafer layout design, and enlarges the chip area. On the other hand, in the embodiments of the present disclosure, because there is no etching release hole, the WLP process can include various processes that use water or other chemical reagents, quality and yield problems caused by chemicals leaking into cavity 600 through any etching release hole may be avoided.

Second, in a comparative process when etching release holes are needed in order to form a cavity, the etching release hole should be made relatively small (e.g., having a diameter of about 10 μm), and the number of the etching release holes should be at least 2, so that corrosive chemicals can better flow through the etching release holes to form the cavity. On the other hand, the volume of the cavity is relatively large compared to the etching release holes, e.g., more than 400 times larger. Therefore, the corrosive chemicals can only slowly flow to the small etching release holes to corrode the dielectric layer to form the cavity, thereby increasing the difficulty of the etching release process. After the corrosion is completed, the corrosive chemical must be clean, which is even more difficult. Therefore, the process time will be long, and the process quality is more difficult to control. When the release holes are formed through top electrode 130, piezoelectric layer 140, and bottom electrode 150 at the front side of cavity 600, due to the asymmetry of the resonator and the variation in the size of the cavities of up to 10 resonators, a boundary layer (i.e., an etch stop layer) needs to be formed. Therefore, the fabrication process is more complicated. In comparison, the structure of the embodiments of the present disclosure exposes a large area of dielectric layer 180 by forming a large opening in bonding substrate 200, so that dielectric layer 180 can be easily etched and released. When multiple resonators are formed on the same substrate, the shape and area of the opening in bonding substrate 200 in each resonator correspond to those of bottom electrode 150 in each resonator, so that the etching release process of the multiple resonators can be completed at approximately the same time, and the corrosion stop point can be accurately controlled without the need for a boundary layer.

Third, cavity 600 of the embodiments of the present embodiment includes the entire opening formed in bonding substrate 200. In other words, the height of cavity 600 is greater than the height of bonding substrate 20). Thus, cavity 600 has a large volume. When wet chemicals are used for the etching release process to form cavity 600, defects of the etching release process and structural adhesion/adhesion during the wafer drying process can be avoided. On the other hand, in a comparative example where no bonding substrate is included, the volume of the cavity is small (e.g., having a height of about 3 μm), it is easy to cause structural adhesion due to residues or surface tension in the etching release process.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method for forming a film bulk acoustic resonator (FBAR) structure, comprising:
    sequentially forming a top electrode layer, a piezoelectric layer, and a bottom electrode layer on a rear side of a first substrate;
    patterning the bottom electrode layer to form a bottom electrode;
    forming a dielectric layer on a rear side of the bottom electrode;
    bonding a bonding substrate onto a rear side of the dielectric layer;
    removing the first substrate;
    after removing the first substrate, patterning the top electrode layer to form a top electrode;
    forming an opening in the bonding substrate;
    after forming the opening in the bonding substrate, selectively removing a portion of the dielectric layer to form a cavity by etching and using the bonding substrate with the opening as an etching mask, the cavity exposing a portion of a side surface of the bottom electrode; and
    bonding a bottom cap wafer onto a rear side of the bonding substrate to seal the cavity.

2. The method of claim 1, further comprising:
    forming a bottom frame layer on a rear side of the bottom electrode layer before patterning the bottom electrode layer to form the bottom electrode.

3. The method of claim 2, further comprising:
    patterning the bottom frame layer while patterning the bottom electrode layer, to form a bottom raised structure along an edge of the bottom electrode.

4. The method of claim 1, further comprising:
    forming a top frame layer on a front side of the top electrode layer before patterning the top electrode layer to form the top electrode.

5. The method of claim 4, further comprising:
    patterning the top frame layer while patterning the top electrode layer, to form a top raised structure along an edge of the top electrode.

6. The method of claim 1, further comprising:
    forming a bottom passivation layer on a rear side of the bottom electrode layer.

7. The method of claim 1, further comprising:
    forming a top passivation layer on the rear side of the first substrate before sequentially forming the top electrode layer, a piezoelectric layer, and a bottom electrode material layer on the rear side of the first substrate.

8. The method of claim 7, further comprising:
    forming a top electrode contact window in the top passivation layer to expose a portion of the top electrode; and
    forming a bottom electrode contact window in the piezoelectric layer to expose a portion of the bottom electrode.

9. The method of claim 8, further comprising:
    forming a top electrode contact layer that electrically connects to the top electrode via the top electrode contact window; and
    forming a bottom electrode contact layer that electrically connects to the bottom electrode via the bottom electrode contact window.

10. The method of claim 1, further comprising:
    before forming the opening in the bonding substrate, forming a temporary bonding layer on a front side of the top electrode; and bonding a temporary bonding carrier onto a front side of the temporary bonding layer.

11. The method of claim 10, further comprising:

after bonding the bottom cap wafer onto the rear side of the bonding substrate, removing the temporary bonding layer and the temporary bonding carrier.

12. The method of claim 1, further comprising:

thinning the bonding substrate.

13. The method of claim 1, further comprising:

forming a bonding layer on the rear side of the bonding substrate; and bonding the bottom cap wafer onto the rear side of the bonding substrate via the bonding layer.

14. The method of claim 13, further comprising:

selectively removing a portion of the bonding layer while forming the cavity.

* * * * *